US012045409B2

(12) United States Patent
Tong et al.

(10) Patent No.: US 12,045,409 B2
(45) Date of Patent: *Jul. 23, 2024

(54) DISPLAY PANEL, DISPLAY APPARATUS, AND METHOD OF FABRICATING DISPLAY PANEL

(71) Applicants: Chengdu BOE Optoelectronics Technology Co., Ltd., Sichuan (CN); BOE Technology Group Co., Ltd., Beijing (CN)

(72) Inventors: Kemeng Tong, Beijing (CN); Fan He, Beijing (CN); Cong Fan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/329,770

(22) Filed: Jun. 6, 2023

(65) Prior Publication Data
US 2023/0315226 A1    Oct. 5, 2023

Related U.S. Application Data

(63) Continuation of application No. 17/299,296, filed as application No. PCT/CN2020/107770 on Aug. 7, 2020.

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G06F 3/0443* (2019.05);
(Continued)

(58) Field of Classification Search
CPC ...... G06F 3/041–047; G06F 2203/041–04114; G06F 3/0412; H10K 59/40
See application file for complete search history.

(56) References Cited

U.S. PATENT DOCUMENTS

2014/0125626 A1    5/2014    Yang et al.
2015/0116242 A1    4/2015    Oh et al.
(Continued)

FOREIGN PATENT DOCUMENTS

CN    102955637 A    3/2013
CN    106055135 A    10/2016
(Continued)

OTHER PUBLICATIONS

International Search Report & Written Opinion mailed Apr. 25, 2021, regarding PCT/CN2020/107770.
(Continued)

*Primary Examiner* — Sanjiv D. Patel
(74) *Attorney, Agent, or Firm* — Intellectual Valley Law, P.C.

(57) ABSTRACT

A display panel is provided. The display panel includes a touch electrode layer including a plurality of first touch electrodes and a plurality of second touch electrodes. In a first region, a first respective one of the plurality of first touch electrodes and a second respective one of the plurality of second touch electrodes directly adjacent to each other are spaced apart by a first gap having a first gap width along a first direction. In a second region, a third respective one of the plurality of first touch electrodes and a fourth respective one of the plurality of second touch electrodes directly adjacent to each other are spaced apart by a second gap having a second gap width along the first direction. The first gap width in at least a portion of the first gap is greater than the second gap width.

20 Claims, 23 Drawing Sheets

(51) Int. Cl.
  *G06F 3/044* (2006.01)
  *H10K 59/124* (2023.01)
  *H10K 59/40* (2023.01)
  *H10K 59/80* (2023.01)
  *H10K 59/88* (2023.01)

(52) U.S. Cl.
  CPC ......... *G06F 3/0446* (2019.05); *H10K 59/124* (2023.02); *H10K 59/40* (2023.02); *H10K 59/873* (2023.02); *H10K 59/88* (2023.02); *G06F 2203/04103* (2013.01); *G06F 2203/04111* (2013.01); *G06F 2203/04112* (2013.01)

(56) References Cited

U.S. PATENT DOCUMENTS

| | | |
|---|---|---|
| 2016/0306464 A1 | 10/2016 | Lee |
| 2017/0010710 A1 | 1/2017 | Kim et al. |
| 2018/0059843 A1 | 3/2018 | Kim |
| 2018/0307343 A1 | 10/2018 | Xie et al. |
| 2019/0050104 A1 | 2/2019 | Na et al. |
| 2019/0107908 A1 | 4/2019 | Zeng et al. |
| 2019/0265820 A1 | 8/2019 | Li |
| 2019/0267434 A1 | 8/2019 | Liu et al. |
| 2020/0266246 A1* | 8/2020 | Bok ............... H10K 50/824 |
| 2021/0026497 A1 | 1/2021 | Lee et al. |
| 2021/0333935 A1 | 10/2021 | Li et al. |

FOREIGN PATENT DOCUMENTS

| | | |
|---|---|---|
| CN | 106164832 A | 11/2016 |
| CN | 107318219 A | 11/2017 |
| CN | 107765914 A | 3/2018 |
| CN | 107797696 A | 3/2018 |
| CN | 107831937 A | 3/2018 |
| CN | 108271417 A | 7/2018 |
| CN | 108319398 A | 7/2018 |
| CN | 108416280 A | 8/2018 |
| CN | 108958534 A | 12/2018 |
| CN | 110489014 A | 11/2019 |
| CN | 110678831 A | 1/2020 |
| CN | 210379052 U | 4/2020 |
| JP | 2015158840 A | 9/2015 |
| TW | M490064 U | 11/2014 |

OTHER PUBLICATIONS

Non-Final Office Action in the U.S. Appl. No. 17/299,296, dated Feb. 16, 2023.
Response to Non-Final Office Action in the U.S. Appl. No. 17/299,296, dated Mar. 21, 2023.
Notice of Allowance in the U.S. Appl. No. 17/299,296, dated Apr. 5, 2023.
International Search Report & Written Opinion mailed Apr. 27, 2021, regarding PCT/CN2020/107772.
Non-Final Office Action in the U.S. Appl. No. 17/311,333, dated Feb. 16, 2023.
Response to Non-Final Office Action in the U.S. Appl. No. 17/311,333, dated Mar. 21, 2023.
Notice of Allowance in the U.S. Appl. No. 17/311,333, dated Apr. 5, 2023.
Final Office Action in the U.S. Appl. No. 17/311,333, dated May 3, 2023.

* cited by examiner

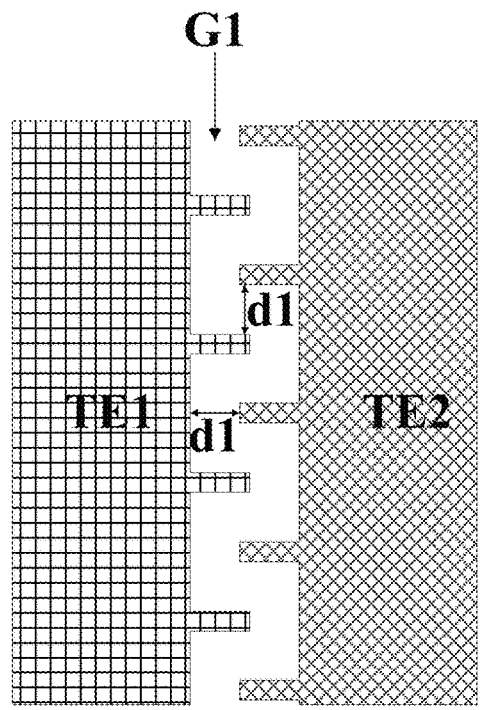
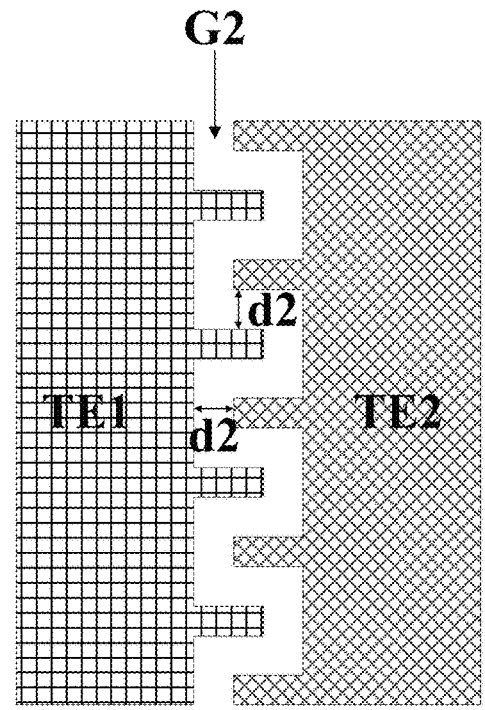
FIG. 2A  FIG. 2B
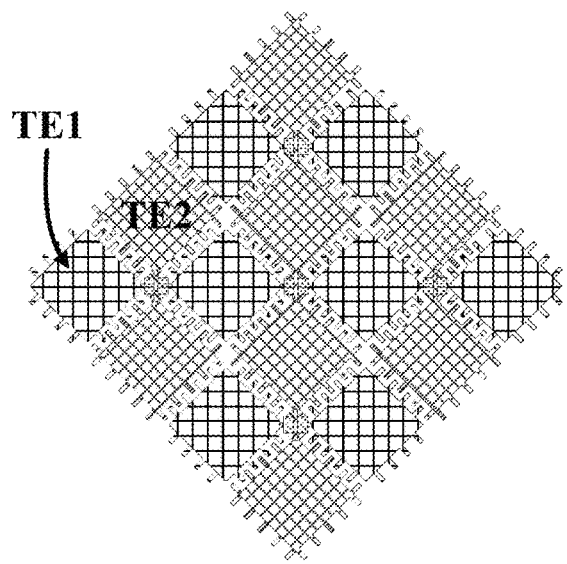
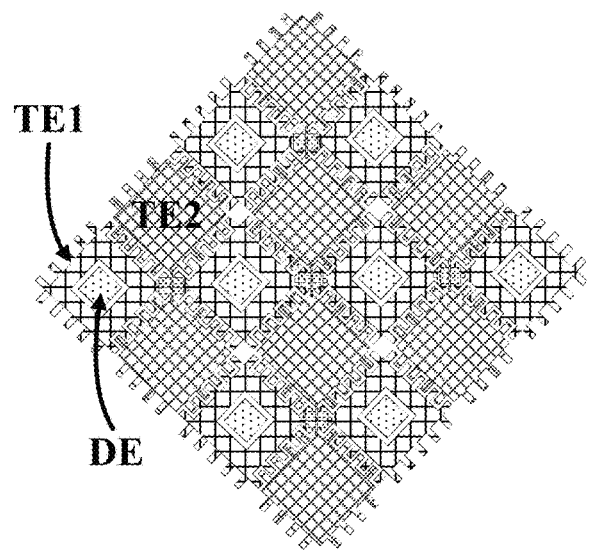
FIG. 3A  FIG. 3B

DISPLAY PANEL, DISPLAY APPARATUS, AND METHOD OF FABRICATING DISPLAY PANEL

CROSS-REFERENCE TO RELATED APPLICATION

This application is a continuation of U.S. application Ser. No. 17/299,296, filed Aug. 7, 2020, which is a national stage application under 35 U.S.C. § 371 of International Application No. PCT/CN2020/107770, filed Aug. 7, 2020. Each of the forgoing applications is herein incorporated by reference in its entirety for all purposes.

TECHNICAL FIELD

The present invention relates to display technology, more particularly, to a display panel, a display apparatus, and a method of fabricating a display panel.

BACKGROUND

Various types of touch panels have been developed. Examples of touch panels include one-glass-solution (OGS) touch panels, on-cell touch panels, and in-cell touch panels. The on-cell touch panels provide high touch control accuracy. The on-cell touch panels can be classified into single-layer-on-cell (SLOC) touch panels and multi-layer-on-cell (MLOC) touch panels. In particular, multiple point touch control can be achieved in the MLOC touch panels with superior touch control accuracy and blanking effects.

SUMMARY

In one aspect, the present disclosure provides a display panel having an array substrate and a counter substrate assembled together; wherein the display panel has a display region configured to display an image, a first window region, a second window region, and an inter-window region between the first window region and the second window region; the display panel comprises a first hole in the first window region and a second hole in the second window region; the inter-window region is directly adjacent to the first window region and directly adjacent to the second window region; wherein the display panel comprises a touch electrode layer in the display region and in the inter-window region, the touch electrode layer comprising a plurality of first touch electrodes and a plurality of second touch electrodes; wherein, in a first region, a first respective one of the plurality of first touch electrodes and a second respective one of the plurality of second touch electrodes directly adjacent to each other are spaced apart by a first gap having a first gap width along a first direction; in a second region, a third respective one of the plurality of first touch electrodes and a fourth respective one of the plurality of second touch electrodes directly adjacent to each other are spaced apart by a second gap having a second gap width along the first direction; and the first gap width in at least a portion of the first gap is greater than the second gap width.

Optionally, the first region is in the inter-window region; the second region is in the display region; and the first window region, the second window region, and the inter-window region are surrounded by the display region.

Optionally, the display panel further comprises a plurality of display elements in the display region and a plurality of dummy display elements in the inter-window region.

Optionally, the display panel comprises an anode on a side of a second planarization layer away from a first planarization layer, the anode is limited in the display region and absent in the inter-window region; a light emitting layer in the display region and in the inter-window region, the light emitting layer in the display region on a side of the anode away from the second planarization layer, the light emitting layer in the inter-window region on a side of the second planarization layer away from the first planarization layer; and a cathode layer in the display region and in the inter-window region, the cathode layer on a side of the light emitting layer away from the second planarization layer.

Optionally, the display panel further comprises an encapsulating layer on a side of the cathode layer away from the light emitting layer, the encapsulating layer encapsulating the plurality of display elements in the display region and the dummy light emitting element in the inter-window region.

Optionally, display elements and thin film transistors are absent in the first window region and the second window region; and the display panel further comprises a first accessory installed in the first hole and a second accessory installed in the second hole.

Optionally, a fifth respective one of the plurality of first touch electrodes and a sixth respective one of the plurality of second touch electrodes directly adjacent to each other are spaced apart by an inter-region gap extending from the inter-window region into the display region; the inter-region gap comprises a first sub-gap in the inter-window region and a second sub-gap in the display region, the first sub-gap directly connected with the second sub-gap; the first sub-gap has a first sub-gap width; the second sub-gap has a second sub-gap width; and the first sub-gap width is greater than the second sub-gap width.

Optionally, the plurality of first touch electrodes and the plurality of second touch electrodes are mesh electrodes comprising mesh electrode lines; multiple mesh electrode lines directly adjacent to the first sub-gap have a line width greater than multiple mesh electrode lines directly adjacent to the second sub-gap.

Optionally, the plurality of first touch electrodes are a plurality of first mesh electrodes, each of which comprising a plurality of first mesh electrode lines; the plurality of second touch electrodes are a plurality of second mesh electrodes, each of which comprising a plurality of second mesh electrode lines; the first gap has a first boundary formed by virtually connecting outer edges of multiple first mesh electrode lines of the first respective one of the plurality of first touch electrodes, and a second boundary formed by virtually connecting outer edges of multiple second mesh electrode lines of the second respective one of the plurality of second touch electrodes; the second gap has a third boundary formed by virtually connecting outer edges of multiple first mesh electrode lines of the third respective one of the plurality of first touch electrodes, and a fourth boundary formed by virtually connecting outer edges of multiple second mesh electrode lines of the fourth respective one of the plurality of second touch electrodes; the first gap width is a first shortest distance between the first boundary and the second boundary; and the second gap width is a second shortest distance between the third boundary and the fourth boundary.

Optionally, the plurality of first touch electrodes and the plurality of second touch electrodes are mesh electrodes comprising mesh electrode lines; the mesh electrode lines comprises a plurality of first mesh electrode lines in the inter-window region and a plurality of second mesh electrode lines in the display region; a respective one of the plurality of first mesh electrode lines has a first line width; a respective one of the plurality of second mesh electrode lines has a second line width; the first line width is greater than the second line width; and an inter-region boundary between the inter-window region and the display region is defined by an imaginary line through which line widths of the mesh electrode lines transition from the first line width to the second line width.

Optionally, the mesh electrode lines comprises an inter-region mesh electrode line extending from the inter-window region into the display region; the inter-region mesh electrode line comprises a first sub-line in the inter-window region and a second sub-line in the display region, the first sub-line directly connected with the second sub-line; the first sub-line has a first sub-line width; the second sub-line has a second sub-line width; and the first sub-line width is greater than the second sub-line width.

Optionally, the inter-region mesh electrode line is directly adjacent to an inter-region gap extending from the inter-window region into the display region; the inter-region gap comprises a first sub-gap in the inter-window region and a second sub-gap in the display region, the first sub-gap directly connected with the second sub-gap; the first sub-gap has a first sub-gap width; the second sub-gap has a second sub-gap width; and the first sub-gap width is greater than the second sub-gap width.

Optionally, at least a first portion of a boundary of the first sub-gap in the inter-window region is formed by virtually connecting outer edges of the first sub-line of the inter-region mesh electrode line; at least a second portion of a boundary of the second sub-gap in the display region is formed by virtually connecting outer edges of the second sub-line of the inter-region mesh electrode line; and the first portion and the second portion are directly connected.

Optionally, the display panel further comprises a plurality of fill patterns in a same layer as the plurality of first touch electrodes and the plurality of second touch electrodes, the plurality of fill patterns insulated from the plurality of first touch electrodes and the plurality of second touch electrodes; wherein the plurality of fill patterns are limited in the display region, and absent in the inter-window region, the first window region, and the second window region.

Optionally, the display panel further comprises a plurality of blanking mesh breaks, a respective one of which breaking a mesh electrode line in an individual mesh electrode block; wherein the plurality of blanking mesh breaks are limited in the display region, and absent in the inter-window region, the first window region, and the second window region.

Optionally, the first gap comprises a plurality of first portions, each of which oriented along a first orientation, and a plurality of second portions, each of which oriented along a second orientation; the second gap comprises a plurality of third portions, each of which oriented along the first orientation, and a plurality of fourth portions, each of which oriented along the second orientation; a respective one of the plurality of first portions has a first portion gap width; a respective one of the plurality of second portions has a second portion gap width; a respective one of the plurality of third portions has a third portion gap width; and a respective one of the plurality of fourth portions has a fourth portion gap width.

Optionally, the first portion gap width is greater than the third portion gap width and the fourth portion gap width; and the second portion gap width is greater than the third portion gap width and the fourth portion gap width.

Optionally, the display panel comprises a touch insulating layer underneath the touch electrode layer and in contact with the touch electrode layer; the touch insulating layer has a first contacting surface in contact with the touch electrode layer in the inter-window region and a second contacting surface in contact with the touch electrode layer in the display region; the first contacting surface has a first degree of unevenness; the second contacting surface has a second degree of unevenness; and the first degree of unevenness is greater than the second degree of unevenness.

Optionally, the display panel comprises an encapsulating layer underneath a touch control structure comprising the touch electrode layer, the encapsulating layer in contact with the touch control structure; the encapsulating layer has a first contacting surface in contact with the touch control structure in the inter-window region and a second contacting surface in contact with the touch control structure in the display region; the first contacting surface has a first degree of unevenness; the second contacting surface has a second degree of unevenness; and the first degree of unevenness is greater than the second degree of unevenness.

Optionally, the touch control structure comprises a touch insulating layer between the touch electrode layer and the encapsulating layer; the touch insulating layer is in contact with the touch electrode layer; and the touch insulating layer is conformally shaped in accordance with the encapsulating layer.

Optionally, the respective one of the plurality of first touch electrodes comprises a plurality of first touch electrode blocks arranged along a first direction; the respective one of the plurality of second touch electrodes comprises a plurality of second touch electrode blocks arranged along a second direction; the plurality of first touch electrode blocks are electrically connected to form a first conductive channel along the first direction, adjacent first touch electrode blocks of the plurality of first touch electrode blocks are connected through a first electrode bridge; the plurality of second touch electrode blocks are electrically connected to form a second conductive channel along the second direction, adjacent second touch electrode blocks of the plurality of second touch electrode blocks are connected through a second electrode bridge; the plurality of first touch electrode blocks, the plurality of second touch electrode blocks, and one of the first electrode bridge and the second electrode bridge are in a first touch material layer, and made of a same material; another of the first electrode bridge and the second electrode bridge is in a second touch material layer different from the first touch material layer.

Optionally, the second touch material layer is between the array substrate and the first touch material layer.

Optionally, the display panel further comprises a plurality of thin film transistors in the display region and in the inter-window region; wherein the display panel comprises: a base substrate; an insulating layer on the base substrate; an active layer of a respective one of the plurality of thin film transistors on a side of the insulating layer away from the base substrate S; a first gate insulating layer on a side of the active layer away from the base substrate; a gate electrode and a first capacitor electrode on a side of the first gate insulating layer away from the insulating layer; a second gate insulating layer on a side of the gate electrode and the first capacitor electrode away from the first gate insulating layer; a second capacitor electrode on a side of the second gate insulating layer away from the first gate insulating layer; an inter-layer dielectric layer on a side of the second capacitor electrode away from the second gate insulating layer; a source electrode and a drain electrode on a side of the inter-layer dielectric layer away from the second gate insulating layer; a passivation layer on a side of the source electrode and the drain electrode away from the inter-layer dielectric layer; a first planarization layer on a side of the passivation layer away from the inter-layer dielectric layer; a second planarization layer on side of the first planarization layer away from the passivation layer; a relay electrode on a side of the second planarization layer away from the first planarization layer; and a pixel definition layer on a side of the second planarization layer away from the base substrate.

Optionally, the display panel further comprises a plurality of display elements in the display region and a plurality of dummy display elements in the inter-window region; wherein the display panel comprises an anode on a side of a second planarization layer away from a first planarization layer, the anode is limited in the display region and absent in the inter-window region; a light emitting layer in the display region and in the inter-window region, the light emitting layer in the display region on a side of the anode away from the second planarization layer, the light emitting layer in the inter-window region on a side of the second planarization layer away from the first planarization layer; a cathode layer in the display region and in the inter-window region, the cathode layer on a side of the light emitting layer away from the second planarization layer; and an encapsulating layer on a side of the cathode layer away from the light emitting layer, the encapsulating layer encapsulating the plurality of display elements in the display region and the dummy light emitting element in the inter-window region.

In another aspect, the present disclosure provides a display apparatus, comprising the display panel described herein or fabricated by a method described herein, and an integrated circuit connected to the display panel In another aspect, the present disclosure provides a method of fabricating a display panel having an array substrate and a counter substrate assembled together, comprising forming a first hole in a first window region; and forming a second hole in a second window region; wherein the display panel is formed to have a display region configured to display an image, the first window region, the second window region, and an inter-window region between the first window region and the second window region; and the inter-window region is directly adjacent to the first window region and directly adjacent to the second window region; the method further comprises forming a touch electrode layer in the display region and in the inter-window region, forming the touch electrode layer comprising forming a plurality of first touch electrodes and forming a plurality of second touch electrodes; wherein forming the touch electrode layer comprises forming a first gap having a first gap width in the inter-window region to space apart a first respective one of the plurality of first touch electrodes and a second respective one of the plurality of second touch electrodes directly adjacent to each other and in the inter-window region; and forming a second gap having a second gap width in the display region to space apart a third respective one of the plurality of first touch electrodes and a fourth respective one of the plurality of second touch electrodes directly adjacent to each other and in the display region; wherein the first gap width is greater than the second gap width.

Optionally, forming the touch electrode layer comprises forming an inter-region gap extending from the inter-window region into the display region to space apart a fifth respective one of the plurality of first touch electrodes and a sixth respective one of the plurality of second touch electrodes directly adjacent to each other; wherein forming the inter-region gap comprises forming a first sub-gap in the inter-window region and forming a second sub-gap in the display region, the first sub-gap directly connected with the second sub-gap; the first sub-gap has a first sub-gap width; the second sub-gap has a second sub-gap width; and the first sub-gap width is greater than the second sub-gap width.

Optionally, the plurality of first touch electrodes and the plurality of second touch electrodes are mesh electrodes comprising mesh electrode lines; multiple mesh electrode lines directly adjacent to the first sub-gap have a line width greater than multiple mesh electrode lines directly adjacent to the second sub-gap.

Optionally, forming the plurality of first touch electrodes comprises forming a plurality of first mesh electrodes, each of which comprising a plurality of first mesh electrode lines; and forming the plurality of second touch electrodes comprises forming a plurality of second mesh electrodes, each of which comprising a plurality of second mesh electrode lines; a first boundary of the first gap is formed by virtually connecting outer edges of multiple first mesh electrode lines of the first respective one of the plurality of first touch electrodes, and a second boundary of the first gap is formed by virtually connecting outer edges of multiple second mesh electrode lines of the second respective one of the plurality of second touch electrodes; a third boundary of the second gap is formed by virtually connecting outer edges of multiple first mesh electrode lines of the third respective one of the plurality of first touch electrodes, and a fourth boundary of the second gap is formed by virtually connecting outer edges of multiple second mesh electrode lines of the fourth respective one of the plurality of second touch electrodes; the first gap width is a first shortest distance between the first boundary and the second boundary; and the second gap width is a second shortest distance between the third boundary and the fourth boundary.

BRIEF DESCRIPTION OF THE FIGURES

The following drawings are merely examples for illustrative purposes according to various disclosed embodiments and are not intended to limit the scope of the present invention.

FIG. 2A is a zoom-in view of two adjacent touch electrodes in an inter-window region of a display panel in some embodiments according to the present disclosure.

FIG. 2B is a zoom-in view of two adjacent touch electrodes in a display region of a display panel in some embodiments according to the present disclosure.

FIG. 3A is a zoom-in view of multiple touch electrodes in an inter-window region of a display panel in some embodiments according to the present disclosure.

FIG. 3B is a zoom-in view of multiple touch electrodes in a display region of a display panel in some embodiments according to the present disclosure.

DETAILED DESCRIPTION

Figure 1A:
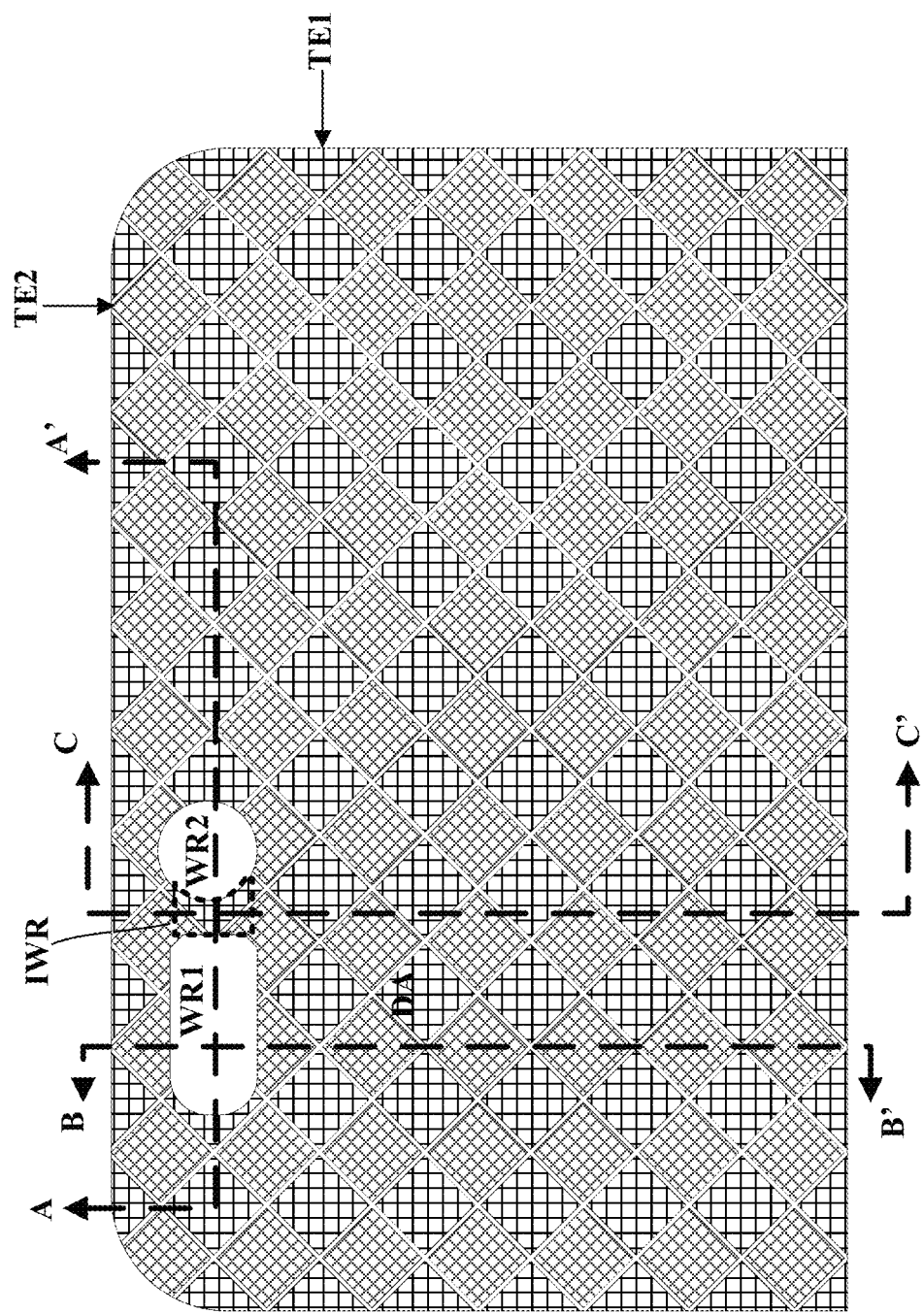
FIG. 1A is a plan view of a display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel, a display apparatus, and a method of fabricating a display panel that substantially obviate one or more of the problems due to limitations and disadvantages of the related art. In one aspect, the present disclosure provides a display panel having an array substrate and a counter substrate assembled together. In some embodiments, the display panel has a display region configured to display an image, a first window region, a second window region, and an inter-window region between the first window region and the second window region. The display panel has a first hole in the first window region and a second hole in the second window region. The inter-window region is directly adjacent to the first window region and directly adjacent to the second window region. The display panel includes a touch electrode layer in the display region and in the inter-window region, the touch electrode layer including a plurality of first touch electrodes and a plurality of second touch electrodes. Optionally, in the inter-window region, a first respective one of the plurality of first touch electrodes and a second respective one of the plurality of second touch electrodes directly adjacent to each other are spaced apart by a first gap having a first gap width. Optionally, in the display region, a third respective one of the plurality of first touch electrodes and a fourth respective one of the plurality of second touch electrodes directly adjacent to each other are spaced apart by a second gap having a second gap width. Optionally, the first gap width is greater than the second gap width.

The inter-window region is a small region between two window regions. In encapsulating the display panel, the encapsulating layer in the inter-window region is typically formed unevenly, resulting in an uneven surface. When forming the touch electrode layer in the inter-window region using related techniques, due to the uneven surface underneath, adjacent touch electrodes (particularly mesh electrode lines from adjacent touch electrodes) are prone to short and various other issues. However, the present disclosure adopts a novel and advantageous touch electrode design that obviate these issues.

As used herein, the term "display region" refers to an area of a display panel where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

Figure 1B:
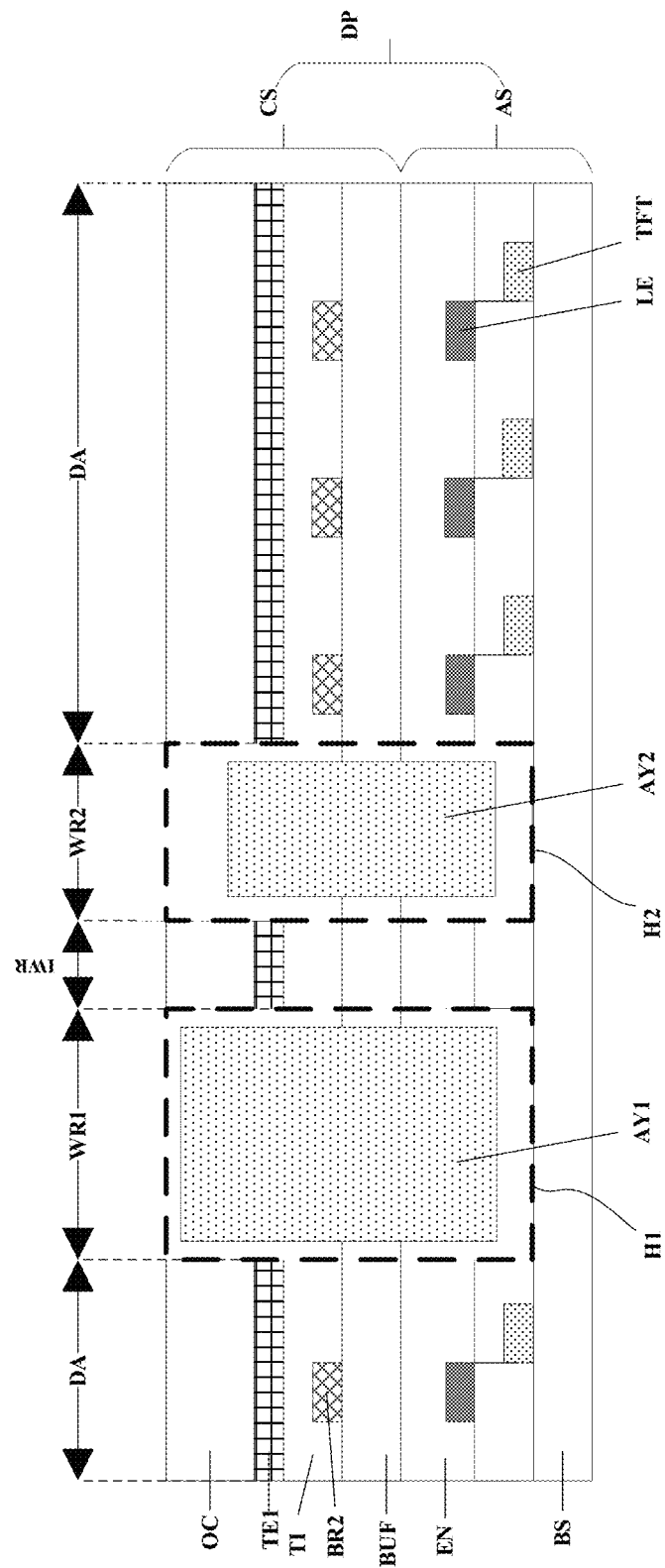
FIG. 1B is a cross-sectional view along an A-A' line in FIG. 1A.
Figure 1C:
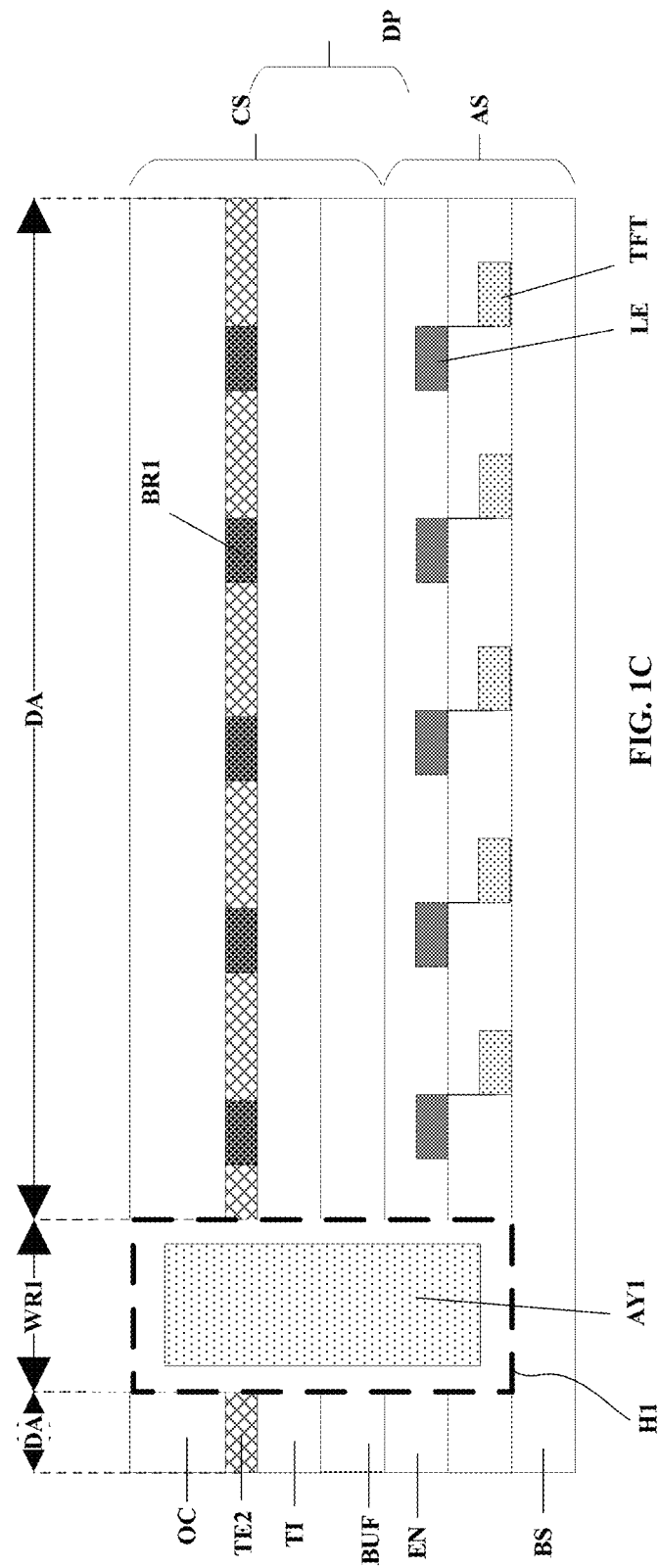
FIG. 1C is a cross-sectional view along a B-B' line in FIG. 1A.
Figure 1D:
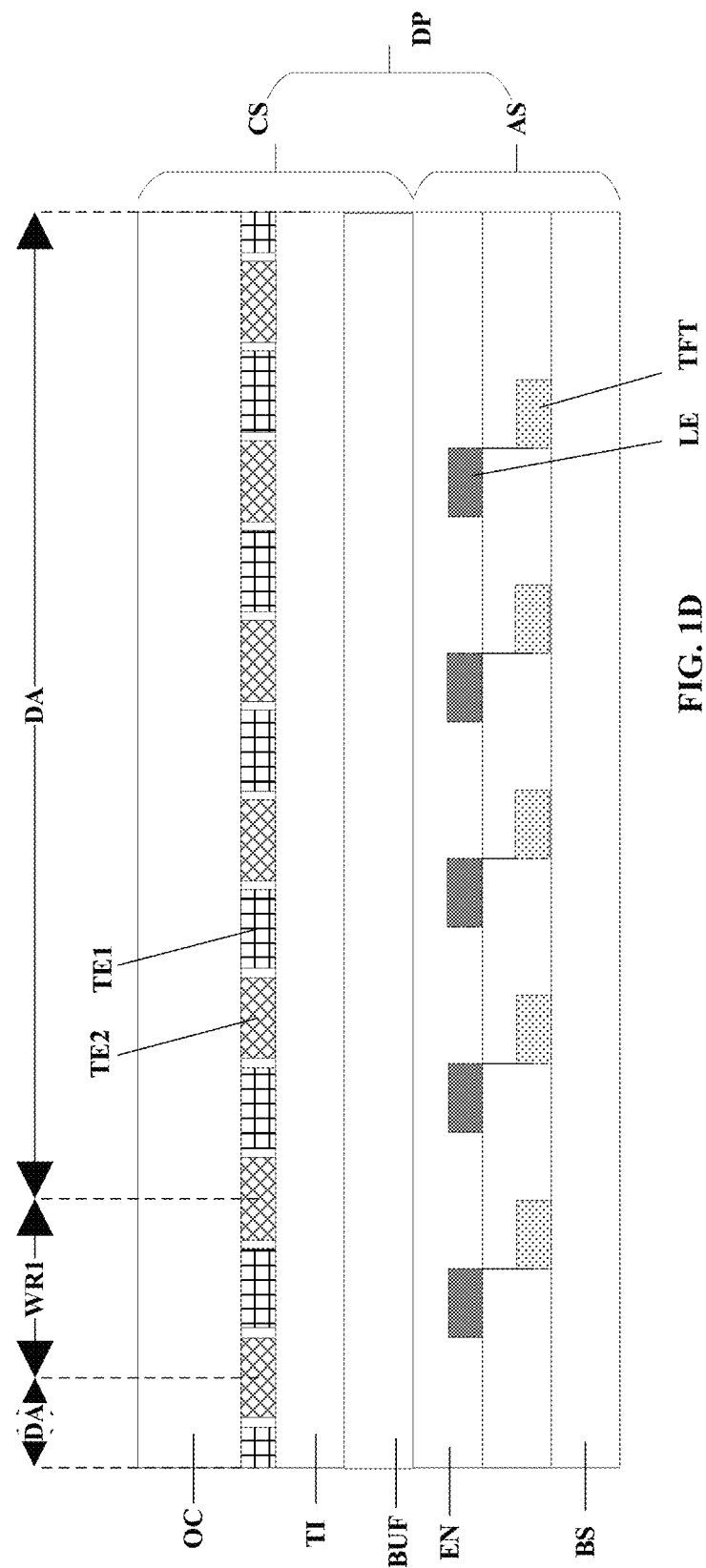
FIG. 1D is a cross-sectional view along a C-C' line in FIG. 1A.

FIG. 1A is a plan view of a display panel in some embodiments according to the present disclosure. FIG. 1B is a cross-sectional view along an A-A' line in FIG. 1A. FIG. 1C is a cross-sectional view along a B-B' line in FIG. 1A. FIG. 1D is a cross-sectional view along a C-C' line in FIG. 1A. Referring to FIGS. 1A to 1D, the display panel in some embodiments includes an array substrate AS and a counter substrate CS assembled together. The display panel has a display region DA configured to display an image, a first window region WR1, a second window region WR2, and an inter-window region IWR between the first window region WR1 and the second window region WR2. The inter-window region IWR is directly adjacent to the first window region WR1 and directly adjacent to the second window region WR2. Optionally, as shown in FIG. 1A, the first window region WR1, the second window region WR2, and the inter-window region IWR are surrounded by the display region DA. For example, the first window region WR1, the second window region WR2, and the inter-window region IWR together form an island region, which is surrounded by the display region DA.

Referring to FIG. 1B and FIG. 1C, the display panel in some embodiments includes a first hole H1 in the first window region WR1 and a second hole H2 in the second window region WR2. In some embodiments, at least one of the first hole H1 and the second hole H2 is a blind hole that does not completely extends through at least one layer of the array substrate AS or the counter substrate CS. Optionally, the first hole H1 is a blind hole that does not extend through the base substrate BS of the array substrate AS (as shown in FIG. 1B). Optionally, the second hole H2 is a blind hole that does not extend through the base substrate BS of the array substrate AS (as shown in FIG. 1B). In some embodiments, at least one of the first hole H1 and the second hole H2 is a through-hole that completely extends through the array substrate AS and the counter substrate CS. Optionally, the first hole H1 extends through the array substrate AS and the counter substrate CS. Optionally, the second hole H2 extends through the array substrate AS and the counter substrate CS.

Referring to FIG. 1B and FIG. 1C, the display panel in some embodiments further includes a first accessory AY1 installed in the first hole H1 and a second accessory AY2 installed in a second hole H2. Examples of accessories include a camera lens and a fingerprint sensor.

In some embodiments, display elements and thin film transistors are absent in the first window region WR1 and the second window region WR2. Optionally, the display elements includes a plurality of light emitting diodes, for example, in an organic light emitting diode display panel. Optionally, the display elements include a liquid crystal layer in a plurality of subpixels, for example, in a liquid crystal display panel. Referring to FIGS. 1B to 1D, in some embodiments, the array substrate AS includes a base substrate BS, a plurality of thin film transistors TFT on the base substrate BS, and a plurality of light emitting elements LE on the base substrate BS and respectively connected to the plurality of thin film transistors TFT. Optionally, the plurality of thin film transistors TFT are absent in the first window region WR1. Optionally, the plurality of thin film transistors TFT are absent in the second window region WR2. Optionally, the plurality of light emitting elements LE are absent in the first window region WR1. Optionally, the plurality of light emitting elements LE are absent in the second window region WR2.

Referring to FIGS. 1B to 1D, in some embodiments, the array substrate AS further includes an encapsulating layer EN encapsulating the plurality of light emitting elements LE. Optionally, the encapsulating layer EN is absent in the first window region WR1. Optionally, the encapsulating layer EN is absent in the second window region WR2. Optionally, the encapsulating layer EN is present in the display region DA and the inter-window region IWR.

Referring to FIGS. 1B to 1D, in some embodiments, the counter substrate CS includes a buffer layer BUF. Optionally, the buffer layer BUF is absent in the first window region WR1. Optionally, the buffer layer BUF is absent in the second window region WR2. Optionally, the buffer layer BUF is present in the display region DA and the inter-window region IWR.

Referring to FIGS. 1B to 1D, in some embodiments, the counter substrate CS further includes a touch insulating layer TI. Optionally, the touch insulating layer TI is absent in the first window region WR1. Optionally, the touch insulating layer TI is absent in the second window region WR2. Optionally, the touch insulating layer TI is present in the display region DA and the inter-window region IWR.

Optionally, the inter-window region IWR is capable of displaying an image. In one example, the display panel in the inter-window region IWR includes one or more light emitting elements. In another example, the display panel in the inter-window region IWR includes one or more thin film transistors.

Optionally, the inter-window region IWR is incapable of displaying an image. In one example, the plurality of light emitting elements LE are absent in the inter-window region IWR. In another example, the plurality of thin film transistors TFT are absent in the inter-window region IWR.

Referring to FIGS. 1A to 1D, the display panel in some embodiments further includes a touch electrode layer in the display region DA and in the inter-window region IWR. The touch electrode layer includes a plurality of first touch electrodes TE1 and a plurality of second touch electrodes TE2, for example, the display panel is a mutual capacitance type touch control display panel. Optionally, the plurality of first touch electrodes TE1 are a plurality of touch scanning electrodes, and the plurality of second touch electrodes TE2 are a plurality of touch sensing electrodes. Optionally, the plurality of first touch electrodes TE1 are a plurality of touch sensing electrodes, and the plurality of second touch electrodes TE2 are a plurality of touch scanning electrodes. Optionally, a respective one of the plurality of first touch electrodes TE1 includes a plurality of first touch electrode blocks, e.g., in a respective row. Adjacent first touch electrode blocks of the plurality of first touch electrode blocks are connected through a first electrode bridge BR1. Optionally, a respective one of the plurality of second touch electrodes TE2 includes a plurality of second touch electrode blocks, e.g., in a respective column. Adjacent second touch electrode blocks of the plurality of second touch electrode blocks are connected through a respective one of a plurality of second electrode bridges BR2.

Optionally, the plurality of first touch electrodes TE1 and the plurality of second touch electrodes TE2 are in a same layer.

Optionally, the plurality of first touch electrodes TE1 and the plurality of second touch electrodes TE2 are in different layers.

Optionally, the plurality of first touch electrodes TE1, the plurality of second touch electrodes TE2, and the first electrode bridge BR1 are in a same layer. Optionally, the plurality of second electrode bridges BR2 are on a side of the touch insulating layer TI away from the buffer layer BUF. Optionally, the plurality of first touch electrodes TE1, the plurality of second touch electrodes TE2, and the first electrode bridge BR1 are on a side of the touch insulating layer TI away from the plurality of second electrode bridges BR2.

Figure 1E:
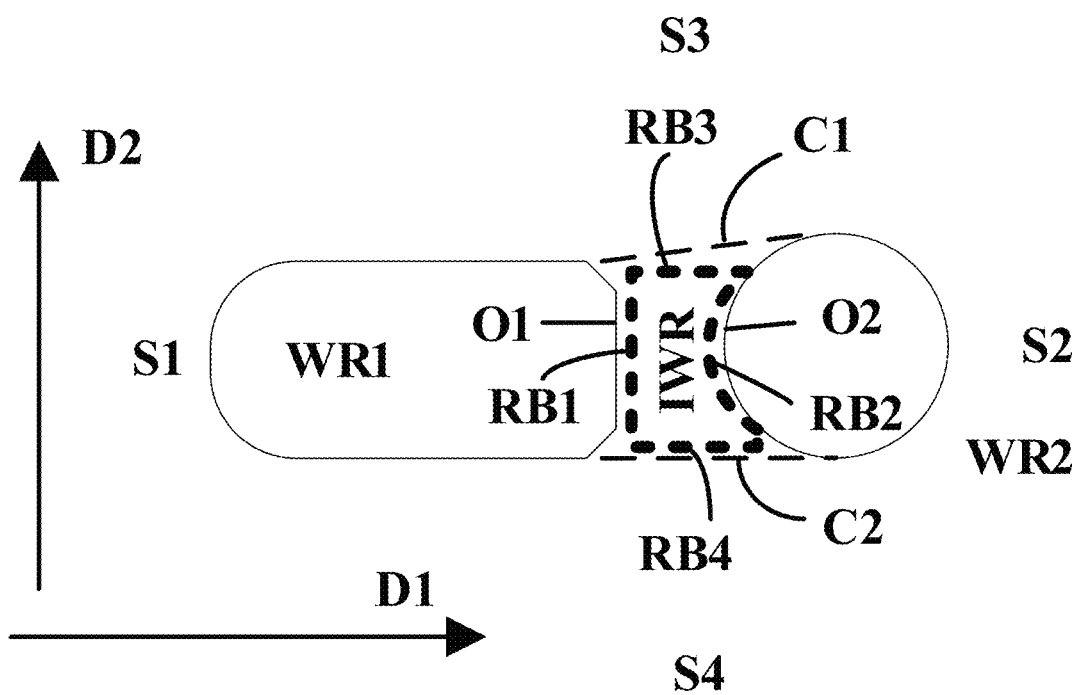
FIG. 1E is a schematic diagram of a first window region, a second window region, and an inter-window region in a display panel depicted in FIG. 1A.

FIG. 1E is a schematic diagram of a first window region, a second window region, and an inter-window region in a display panel depicted in FIG. 1A. Referring to FIG. 1E, in some embodiments, the inter-window region IWR is defined by boundaries on at least four sides including a first side S1, a second side S2, a third side S3, and a fourth side S4. Optionally, the first side S1 and the second side S2 are arranged along a first direction D1 along the first window region WR1 to the second window region WR2. Optionally, the third side S2 and the fourth side S4 are arranged along a second direction D2 substantially perpendicular to the first direction D1.

Optionally, a first region boundary RB1 of the inter-window region IWR on the first side S1 does not exceed a first outer boundary O1 of the first window region WR1 directly adjacent to the inter-window region IWR. In one example, the first region boundary RB1 of the inter-window region IWR on the first side S1 is between the first outer boundary O1 of the first window region WR1 directly adjacent to the inter-window region IWR and a second outer boundary O2 of the second window region WR2 directly adjacent to the inter-window region IWR. In another example, the first region boundary RB1 of the inter-window region IWR on the first side S1 at least partially or completely overlaps with the first outer boundary O1 of the first window region WR1 directly adjacent to the inter-window region IWR. In another example, the first region boundary RB1 of the inter-window region IWR on the first side S1 is non-overlapping with the first outer boundary O1 of the first window region WR1 directly adjacent to the inter-window region IWR.

Optionally, a second region boundary RB2 of the inter-window region IWR on the second side S2 does not exceed a second outer boundary O2 of the second window region WR2 directly adjacent to the inter-window region IWR. In one example, the second region boundary RB2 of the inter-window region IWR on the second side S2 is between the first outer boundary O1 of the first window region WR1 directly adjacent to the inter-window region IWR and the second outer boundary O2 of the second window region WR2 directly adjacent to the inter-window region IWR. In another example, the second region boundary RB2 of the inter-window region IWR on the second side S2 at least partially or completely overlaps with the second outer boundary O2 of the second window region WR2 directly adjacent to the inter-window region IWR. In another example, the second region boundary RB2 of the inter-window region IWR on the second side S2 is non-overlapping with the second outer boundary O2 of the second window region WR2 directly adjacent to the inter-window region IWR.

Optionally, a third region boundary RB3 of the inter-window region IWR on the third side S3 does not exceed a first imaginary connecting line C1 virtually connecting outer edges of the first window region WR1 and the second window region WR2 on the third side S3.

Optionally, a fourth boundary RB4 of the inter-window region IWR on the fourth side S4 does not exceed a second imaginary connecting line C2 virtually connecting outer edges of the first window region WR1 and the second window region WR2 on the fourth side S4.

In one example, the third region boundary RB3 of the inter-window region IWR on the third side S3 is between the first imaginary connecting line C1 and the second imaginary connecting line C2. In another example, the third region boundary RB3 of the inter-window region IWR on the third side S3 at least partially or completely overlaps with the first imaginary connecting line C1. In another example, the third region boundary RB3 of the inter-window region IWR on the third side S3 is non-overlapping with the first imaginary connecting line C1.

In one example, the fourth boundary RB4 of the inter-window region IWR on the third side S3 is between the first imaginary connecting line C1 and the second imaginary connecting line C2. In another example, the fourth boundary RB4 of the inter-window region IWR on the third side S3 at least partially or completely overlaps with the second imaginary connecting line C2. In another example, the fourth boundary RB4 of the inter-window region IWR on the third side S3 is non-overlapping with the second imaginary connecting line C2.

Figure 1F:
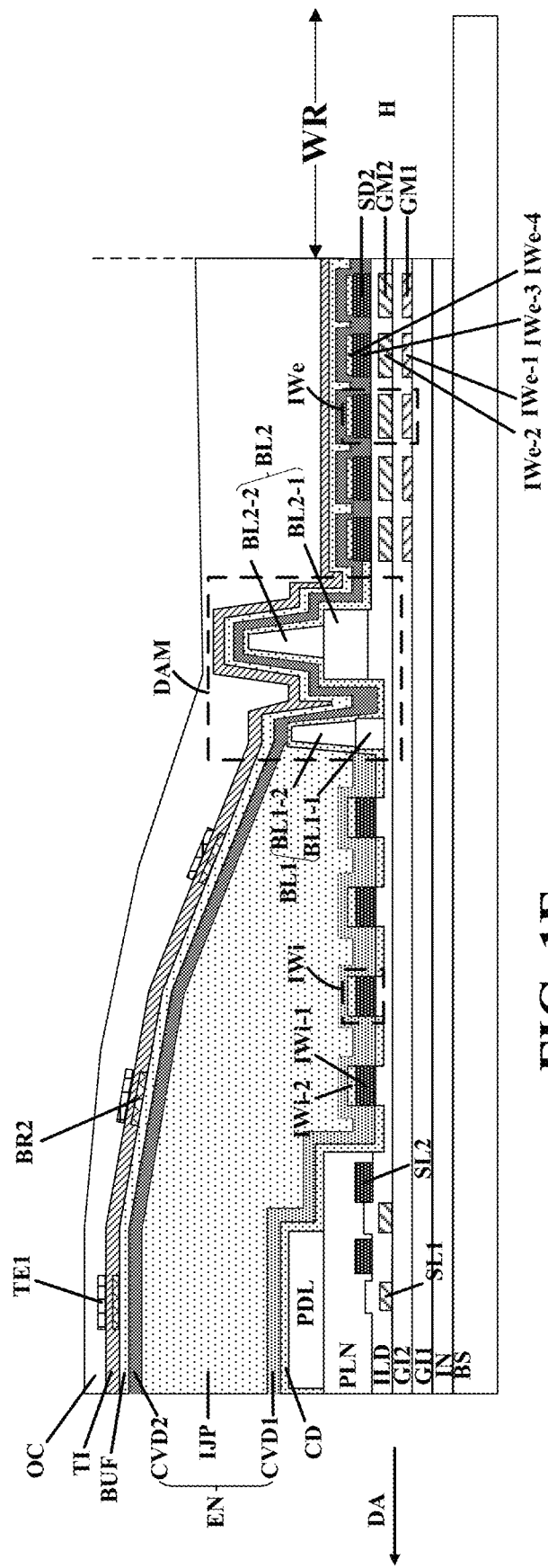
FIG. 1F illustrates a detailed structure in a region transitioning from a display region to a window region in a display panel in some embodiments according to the present disclosure.

FIG. 1F illustrates a detailed structure in a region transitioning from a display region to a window region in a display panel in some embodiments according to the present disclosure. Referring to FIG. 1F, in some embodiments, the region transitioning from a display region to a window region WR (e.g., a first window region WR1 or a second window region WR2) includes a base substrate BS (e.g., a flexible base substrate); an insulating layer IN on the base substrate BS; a first gate insulating layer GI1 on a side of the insulating layer IN away from the base substrate BS; a first gate metal layer GM1 on a side of the first gate insulating layer GI1 away from the insulating layer IN; a second gate insulating layer GI2 on a side of the first gate metal layer GM1 away from the first gate insulating layer GI1; a second gate metal layer GM2 on a side of the second gate insulating layer GI2 away from the first gate insulating layer GI1; an inter-layer dielectric layer ILD on a side of the second gate metal layer GM2 away from the second gate insulating layer GI2; a second SD metal layer SD2 on a side of the inter-layer dielectric layer ILD away from the second gate insulating layer GI2; a planarization layer PLN on a side of the second SD metal layer SD2 away from the inter-layer dielectric layer ILD, a pixel definition layer PDL defining a plurality of subpixel regions for the plurality of light emitting elements LE, the pixel definition layer PDL on a side of the planarization layer PLN away from the base substrate BS; a cathode layer CD on a side the pixel definition layer PDL, the planarization layer PLN, and the second SD metal layer SD2 away from the base substrate BS; an encapsulating layer EN encapsulating the plurality of light emitting elements, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. Optionally, the display panel, in the region transitioning from the display region DR to the window region WR, further includes a passivation layer between the inter-layer dielectric layer ILD and the planarization layer PLN.

In some embodiments, the display panel, in the region transitioning from the display region DR to the window region WR, includes a barrier structure DAM completely surrounding a hole H (e.g., the first hole H1 or the second hole H2). In some embodiment, the barrier structure DAM includes a first barrier layer BL1 and a second barrier layer BL2 sequentially surrounding the hole H. Optionally, the first barrier layer BL1 includes a first barrier sub-layer BL1-1 and a second barrier sub-layer BL1-2. Optionally, the second barrier layer BL2 includes a third barrier sub-layer BL2-1 and a fourth barrier sub-layer BL2-2. Optionally, the first barrier sub-layer BL1-1 and the third barrier sub-layer BL2-1 are in a same layer and formed in a single patterning process. Optionally, the second barrier sub-layer BL1-2 and the fourth barrier sub-layer BL2-2 are in a same layer and formed in a single patterning process. Optionally, the first barrier sub-layer BL1-1 has a thickness less than a thickness of the third barrier sub-layer BL2-1. Optionally, the first barrier sub-layer BL1-1, the third barrier sub-layer BL2-1 and the planarization layer PLN, are in a same layer and formed in a single patterning process. Optionally, the second barrier sub-layer BL1-2, the fourth barrier sub-layer BL2-2, and the pixel definition layer PDL are in a same layer and formed in a single patterning process.

Figure 1G:
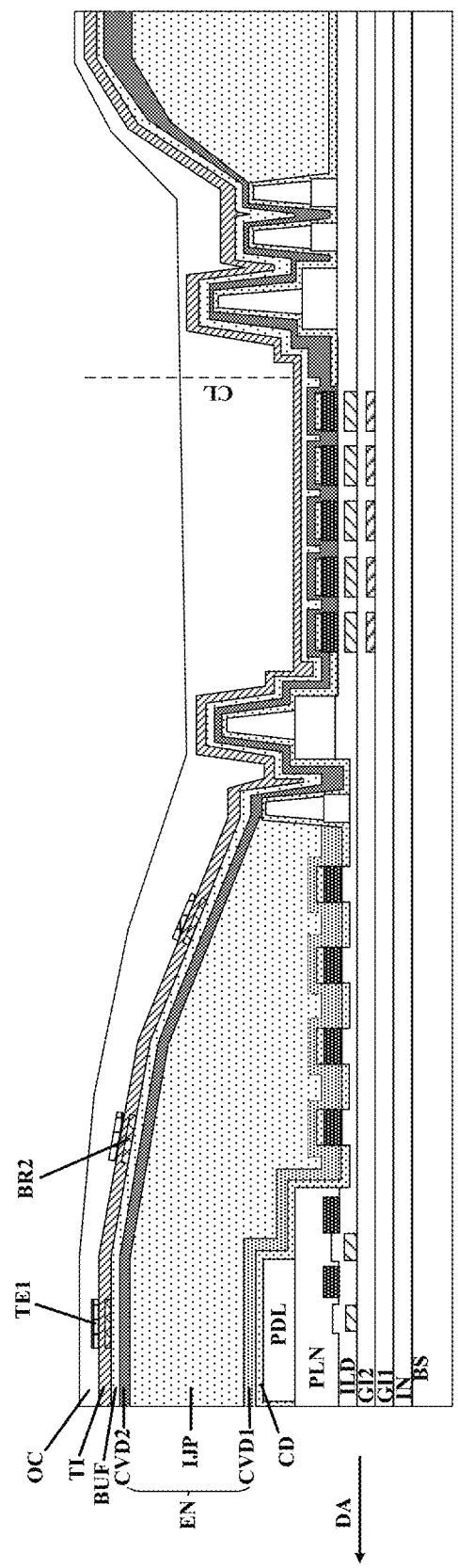
FIG. 1G illustrates a method of forming a window region in a display panel in some embodiments according to the present disclosure.
Figure 1H:
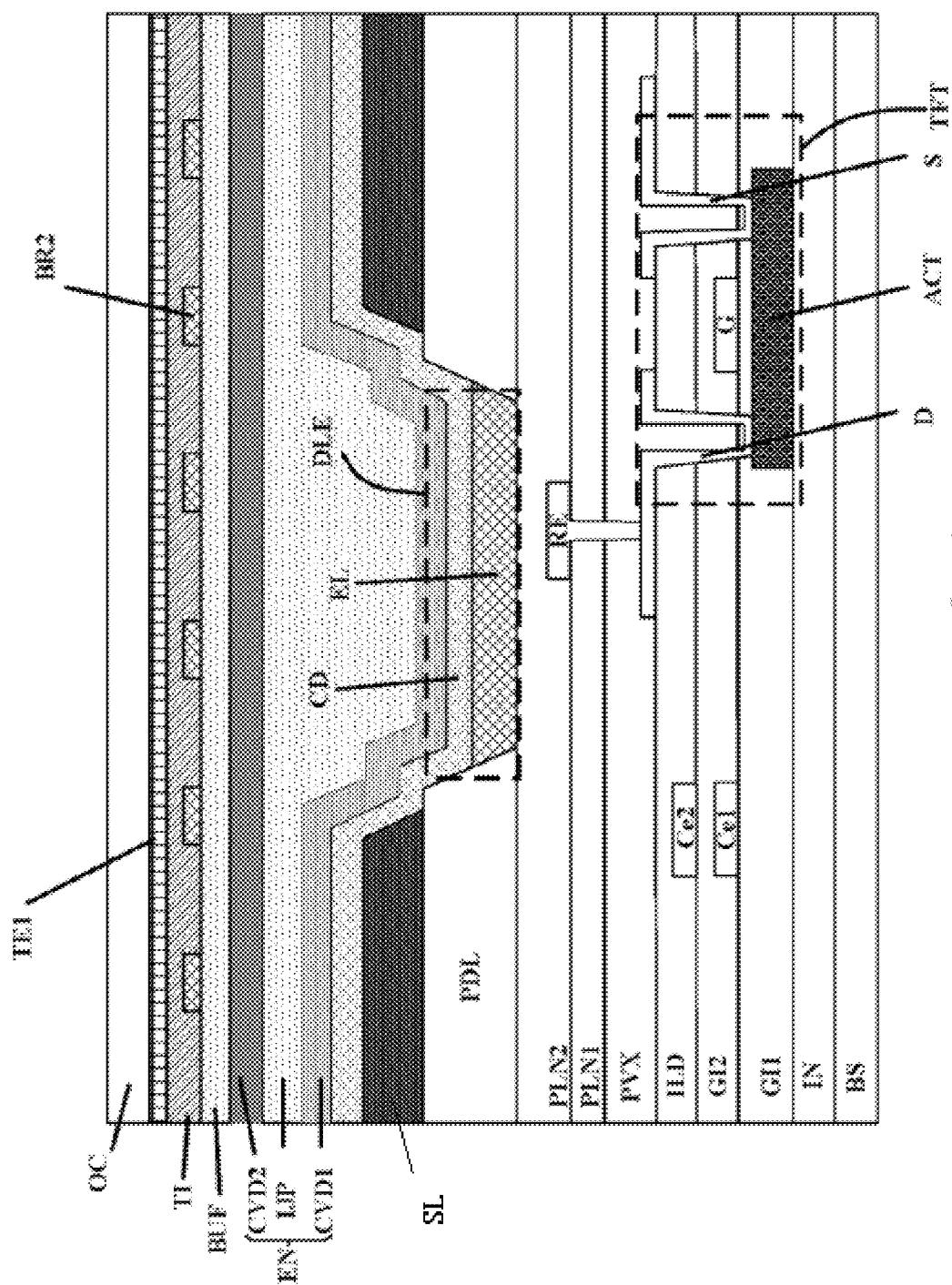
FIG. 1H illustrates a detailed structure in an inter-window region in a display panel in some embodiments according to the present disclosure.

In some embodiments, the display panel, in the region transitioning from the display region DR to the window region WR, further includes a spacer layer SL (as shown in FIG. 1H) on a side of the pixel definition layer PDL away from the base substrate BS. Optionally, the first barrier layer BL1 further includes another sub-layer in a same layer as the spacer layer. Optionally, the second barrier layer BL2 further includes another sub-layer in a same layer as the spacer layer.

In some embodiments, the first barrier layer BL1 only includes the second barrier sub-layer BL1-2 but does not include the first barrier sub-layer BL1-1.

In some embodiments, the display panel further includes a plurality of internal isolation walls IWi in a region between the barrier structure DAM and the display region DA. A respective one of the plurality of internal isolation walls IWi includes a first internal wall sub-layer IWi-1 and a second internal wall sub-layer IWi-2. Optionally, the first internal wall sub-layer IWi-1 is a part of the second SD metal layer SD2. Optionally, the second internal wall sub-layer IWi-2 is in a same layer as, and optionally formed in a single patterning process as, the cathode layer CD. Optionally, a total number of the plurality of internal isolation walls Iwi is in a range of 2 to 6, e.g., 2, 3, 4, 5, or 6.

In some embodiments, the display panel further includes a plurality of external isolation walls IWe in a region between the barrier structure DAM and the window region WR. A respective one of the plurality of external isolation walls IWe includes a first external wall sub-layer IWe-1, a second external wall sub-layer IWe-2, a third external wall sub-layer IWe-3, and a fourth external wall sub-layer IWe-4. Optionally, the first external wall sub-layer IWe-1 is a part of the first gate metal layer GM1. Optionally, the second external wall sub-layer IWe-2 is a part of the second gate metal layer GM2. Optionally, the third external wall sub-layer IWe-3 is a part of the second SD metal layer SD2. Optionally, the fourth external wall sub-layer IWe-4 is in a same layer as, and optionally formed in a single patterning process as, the cathode layer CD. Optionally, a total number of the plurality of external isolation walls IWe is in a range of 2 to 8, e.g., 2, 3, 4, 5, 6, 7, or 8.

In some embodiments, the display panel further includes a plurality of first signal lines SL1 and a plurality of second signal lines SL2 in the region transitioning from the display region DR to the window region WR. The plurality of first signal lines SL1 and the plurality of second signal lines SL2 are on a side of the plurality of internal isolation walls IWi away from the barrier structure DAM. Optionally, the plurality of first signal lines SL1 are in a same layer as the second gate metal layer GM2. Optionally, the plurality of second signal lines SL2 are in a same layer as the second SD metal layer SD2. In some embodiments, the display panel, in the region transitioning from the display region DR to the window region WR, further includes a plurality of third signal lines in a same layer as the first gate metal layer GM1.

FIG. 1G illustrates a method of forming window region in a display panel in some embodiments according to the present disclosure. FIG. 1G shows a structure of the display panel prior to forming the window region WR. Referring to FIG. 1G, the display panel is cut along a cutting line CL to remove a portion of the structure, thereby forming a hole H as shown in FIG. 1F.

FIG. 1H illustrates a detailed structure in an inter-window region in a display panel in some embodiments according to the present disclosure. Referring to FIG. 1H, the display panel in the inter-window region in some embodiments includes a base substrate BS (e.g., a flexible base substrate); an insulating layer IN on the base substrate BS; an active layer ACT of a respective one of a plurality of thin film transistors TFT on a side of the insulating layer IN away from the base substrate BS; a first gate insulating layer GI1 on a side of the active layer ACT away from the base substrate BS; a gate electrode G and a first capacitor electrode Ce1 (both are parts of a first gate metal layer) on a side of the first gate insulating layer GI1 away from the insulating layer IN; a second gate insulating layer GI2 on a side of the gate electrode G and the first capacitor electrode Ce1 away from the first gate insulating layer GI1; a second capacitor electrode Ce2 (a part of a second gate metal layer) on a side of the second gate insulating layer GI2 away from the first gate insulating layer GI1; an inter-layer dielectric layer ILD on a side of the second capacitor electrode Ce2 away from the second gate insulating layer GI2; a source electrode S and a drain electrode D (parts of a first SD metal layer) on a side of the inter-layer dielectric layer ILD away from the second gate insulating layer GI2; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a second planarization layer PLN2 on side of the first planarization layer PLN1 away from the passivation layer PVX; a relay electrode RE (part of a second SD metal layer) on a side of the second planarization layer PLN2 away from the first planarization layer PLN1; a pixel definition layer PDL defining a dummy subpixel aperture and on a side of the second planarization layer PLN2 away from the base substrate BS; and a dummy light emitting element DLE in the dummy subpixel aperture. The dummy light emitting element DLE includes a light emitting layer EL on a side of the second planarization layer PLN2 away from the first planarization layer PLN1; and a cathode layer CD on a side of the light emitting layer EL away from the second planarization layer PLN2. In the inter-window region, the dummy light emitting element DLE does not include an anode, and thus is not capable of emitting light. The display panel in the inter-window region further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display panel in the inter-window region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the display panel in the inter-window region does not include the passivation layer PVX, e.g., the inter-layer dielectric layer ILD is in direct contact with the first planarization layer PLN1.

Figure 1I:
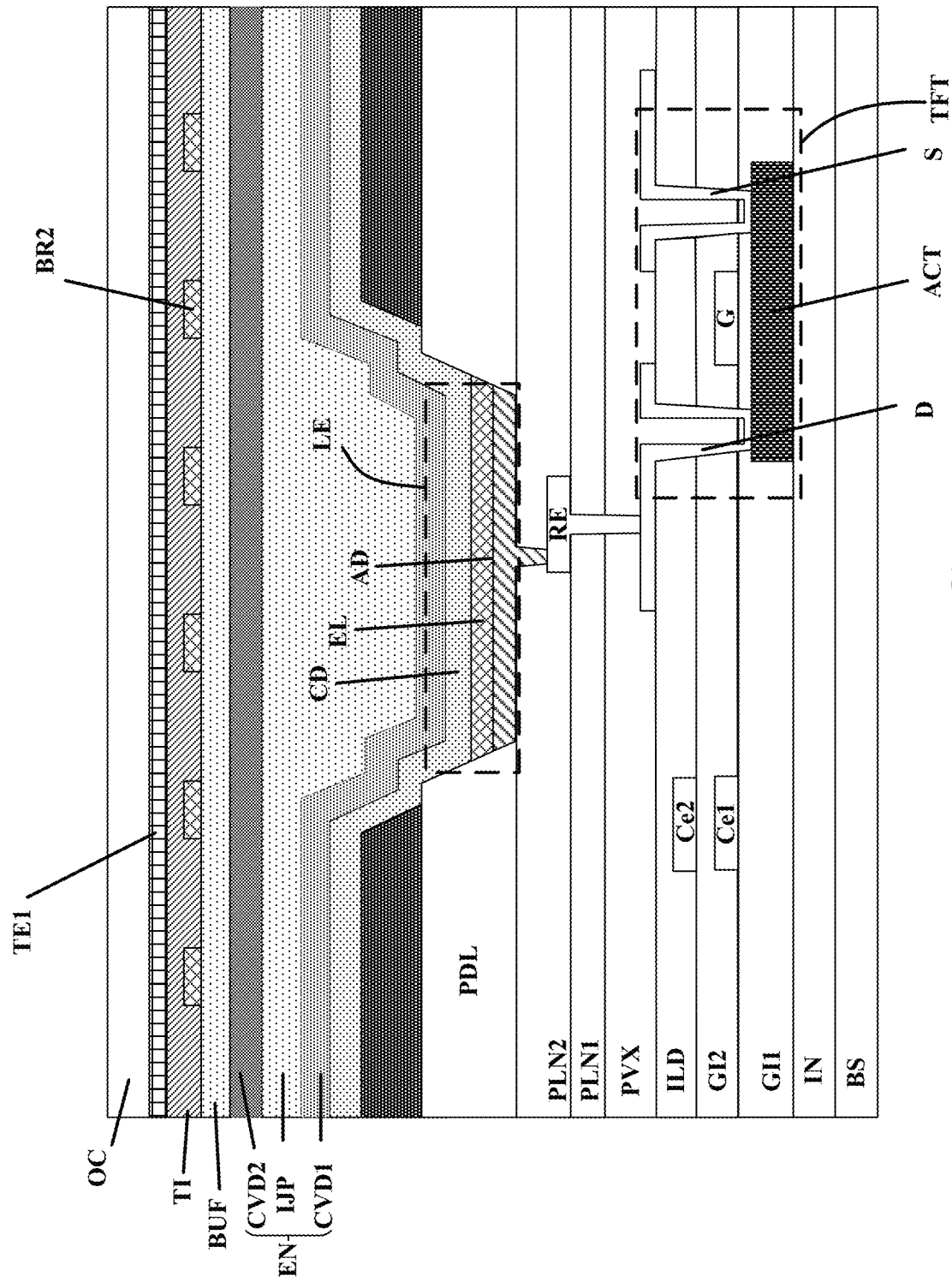
FIG. 1I illustrates a detailed structure in a display region in a display panel in some embodiments according to the present disclosure.

FIG. 1I illustrates a detailed structure in a display region in a display panel in some embodiments according to the present disclosure. Referring to FIG. 1I, the display panel in the display region in some embodiments includes a base substrate BS (e.g., a flexible base substrate); an insulating layer IN on the base substrate BS; an active layer ACT of a respective one of a plurality of thin film transistors TFT on a side of the insulating layer IN away from the base substrate BS; a first gate insulating layer GI1 on a side of the active layer ACT away from the base substrate BS; a gate electrode G and a first capacitor electrode Ce1 (both are parts of a first gate metal layer) on a side of the first gate insulating layer GI1 away from the insulating layer IN; a second gate insulating layer GI2 on a side of the gate electrode G and the first capacitor electrode Ce1 away from the first gate insulating layer GI1; a second capacitor electrode Ce2 (a part of a second gate metal layer) on a side of the second gate insulating layer GI2 away from the first gate insulating layer GI1; an inter-layer dielectric layer ILD on a side of the second capacitor electrode Ce2 away from the second gate insulating layer GI2; a source electrode S and a drain electrode D (parts of a first SD metal layer) on a side of the inter-layer dielectric layer ILD away from the second gate insulating layer GI2; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a second planarization layer PLN2 on side of the first planarization layer PLN1 away from the passivation layer PVX; a relay electrode RE (part of a second SD metal layer) on a side of the second planarization layer PLN2 away from the first planarization layer PLN1; a pixel definition layer PDL defining a subpixel aperture and on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display panel in the display region further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display panel in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI. Optionally, the display panel in the display region does not include the passivation layer PVX, e.g., the inter-layer dielectric layer ILD is in direct contact with the first planarization layer PLN1

Figure 1J:
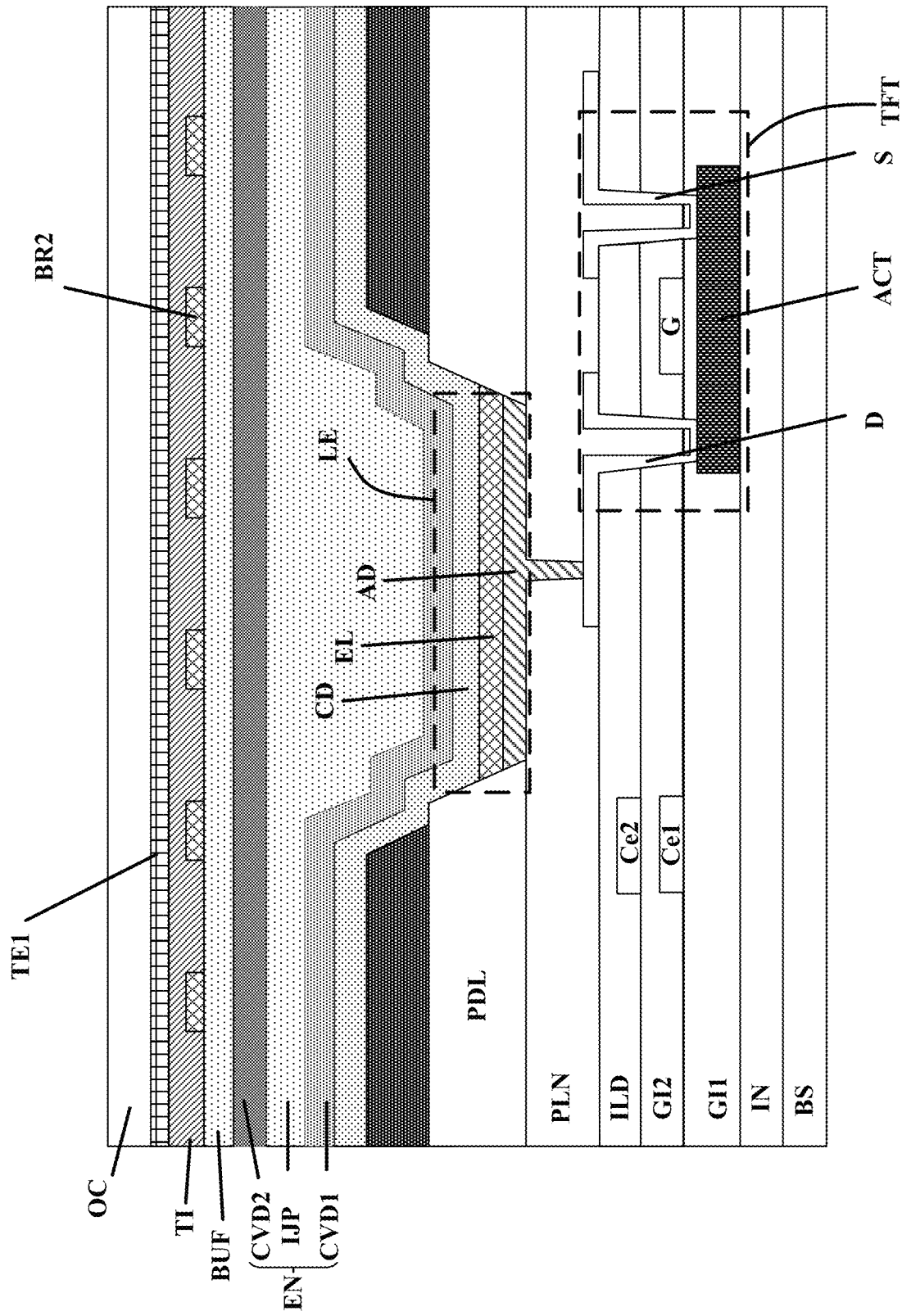
FIG. 1J illustrates a detailed structure in a display region in a display panel in some embodiments according to the present disclosure.

FIG. 1J illustrates a detailed structure in a display region in a display panel in some embodiments according to the present disclosure. Referring to FIG. 1J, the display panel in the display region in some embodiments includes a base substrate BS (e.g., a flexible base substrate); an insulating layer IN on the base substrate BS; an active layer ACT of a respective one of a plurality of thin film transistors TFT on a side of the insulating layer IN away from the base substrate BS; a first gate insulating layer GI1 on a side of the active layer ACT away from the base substrate BS; a gate electrode G and a first capacitor electrode Ce1 (both are parts of a first gate metal layer) on a side of the first gate insulating layer GI1 away from the insulating layer IN; a second gate insulating layer GI2 on a side of the gate electrode G and the first capacitor electrode Ce1 away from the first gate insulating layer GI1; a second capacitor electrode Ce2 (a part of a second gate metal layer) on a side of the second gate insulating layer GI2 away from the first gate insulating layer GI1; an inter-layer dielectric layer ILD on a side of the second capacitor electrode Ce2 away from the second gate insulating layer GI2; a source electrode S and a drain electrode D on a side of the inter-layer dielectric layer ILD away from the second gate insulating layer GI2; a planarization layer PLN on a side of the source electrode S and the drain electrode D away from the inter-layer dielectric layer ILD; a pixel definition layer PDL defining a subpixel aperture and on a side of the planarization layer PLN away from the base substrate BS; and a light emitting element LE in the subpixel aperture. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display panel in the display region further includes an encapsulating layer EN encapsulating the dummy light emitting element DLE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IJP on a side of the first inorganic encapsulating sub-layer CVD1 away from the base substrate BS, and a second inorganic encapsulating sub-layer CVD2 on a side of the organic encapsulating sub-layer IJP away from the first inorganic encapsulating sub-layer CVD1. The display panel in the display region further includes a buffer layer BUF on a side of the encapsulating layer EN away from the base substrate BS; a plurality of second electrode bridges BR2 on a side of the buffer layer BUF away from the encapsulating layer EN; a touch insulating layer TI on a side of the plurality of second electrode bridges BR2 away from the buffer layer BUF; a plurality of first touch electrodes TE1 on a side of the touch insulating layer TI away from the buffer layer BUF; and an overcoat layer OC on a side of the plurality of first touch electrodes TE1 away from the touch insulating layer TI.

Figure 1K:
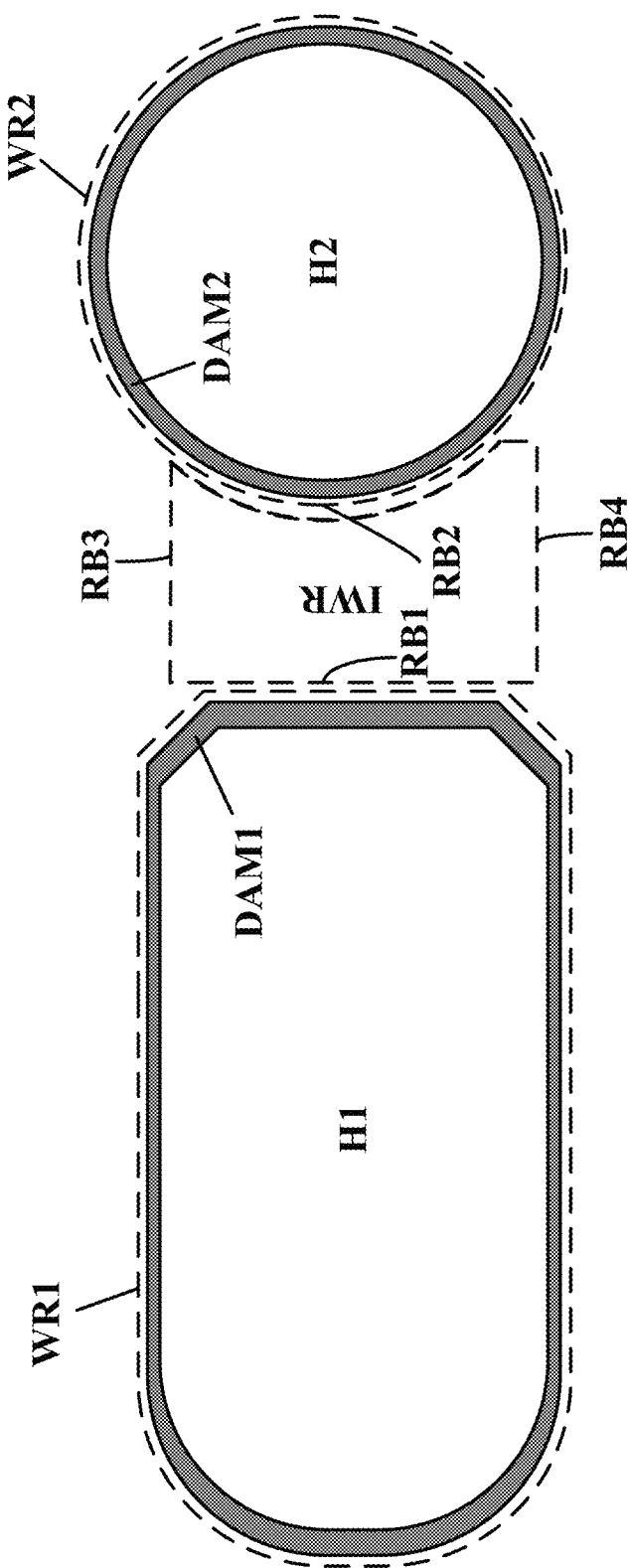
FIG. 1K is a schematic diagram illustrating barrier structures defining window regions and an inter-window region in a display panel in some embodiments according to the present disclosure.

FIG. 1K is a schematic diagram illustrating barrier structures defining window regions and inter-window region in a display panel in some embodiments according to the present disclosure. Referring to FIG. 1K, the display panel includes a first barrier structure DAM1 and a second barrier structure DAM2. The first barrier structure DAM1 completely surrounds the first hole H1, and a second barrier structure DAM2 completely surrounds the second hole H2. The first region boundary RB1 of the inter-window region IWR is a boundary adjacent to the first barrier structure DAM1, the second region boundary RB2 of the inter-window region IWR is a boundary adjacent to the second barrier structure DAM2.

FIG. 2A is a zoom-in view of two adjacent touch electrodes in an inter-window region of a display panel in some embodiments according to the present disclosure. Referring to FIG. 2A, in the inter-window region, a first respective one of the plurality of first touch electrodes TE1 and a second respective one of the plurality of second touch electrodes TE2 directly adjacent to each other are spaced apart by a first gap G1 having a first gap width d1.

FIG. 2B is a zoom-in view of two adjacent touch electrodes in a display region of a display panel in some embodiments according to the present disclosure. in the display region, a third respective one of the plurality of first touch electrodes TE1 and a fourth respective one of the plurality of second touch electrodes TE2 directly adjacent to each other are spaced apart by a second gap G2 having a second gap width d2.

Optionally, the first gap width d1 is greater than the second gap width d2. Optionally, the first gap width d1 is greater than the second gap width d2 by at least 20%, e.g., by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, by at least 200%, by at least 225%, by at least 250%, or by at least 300%. Optionally, the first gap width d1 is in a range of 5 μm to 50 μm, e.g., 5 μm to 10 μm, 10 μm to 15 μm, 15 μm to 20 μm, 20 μm to 25 μm, 25 μm to 30 μm, 30 μm to 35 μm, 35 μm to 40 μm, 40 μm to 45 μm, or 45 μm to 50 μm. Optionally, the second gap width d2 is in a range of 1 μm to 10 μm, e.g., 1 μm to 2 μm, 2 μm to 3 μm, 3 μm to 4 μm, 4 μm to 5 μm, 5 μm to 6 μm, 6 μm to 7 μm, 7 μm to 8 μm, 8 μm to 9 μm, or 9 μm to 10 μm. In one example, the first gap width d1 is approximately 10 μm, and the second gap width d2 is approximately 5.2 μm.

In some embodiments, the display panel further includes a plurality of fill patterns in a same layer as the plurality of first touch electrodes or as the plurality of second touch electrodes. The plurality of fill patterns are insulated from the plurality of first touch electrodes and the plurality of second touch electrodes. FIG. 3A is a zoom-in view of multiple touch electrodes in an inter-window region of a display panel in some embodiments according to the present disclosure. FIG. 3B is a zoom-in view of multiple touch electrodes in a display region of a display panel in some embodiments according to the present disclosure. Referring to FIG. 3A and FIG. 3B, in some embodiments, the plurality of fill patterns DE are limited in the display region DA, and absent in the inter-window region IWR, the first window region WR1, and the second window region WR2.

As used herein, the term "same layer" refers to the relationship between the layers simultaneously formed in the same step. In one example, the plurality of fill patterns DE and the plurality of first touch electrodes TE1 are in a same layer when they are formed as a result of one or more steps of a same patterning process performed in a material deposited in a same deposition process. In another example, the plurality of fill patterns DE and the plurality of first touch electrodes TE1 can be formed in a same layer by simultaneously performing the step of forming the plurality of fill patterns DE and the step of forming the plurality of first touch electrodes TE1. The term "same layer" does not always mean that the thickness of the layer or the height of the layer in a cross-sectional view is the same.

Figure 4:
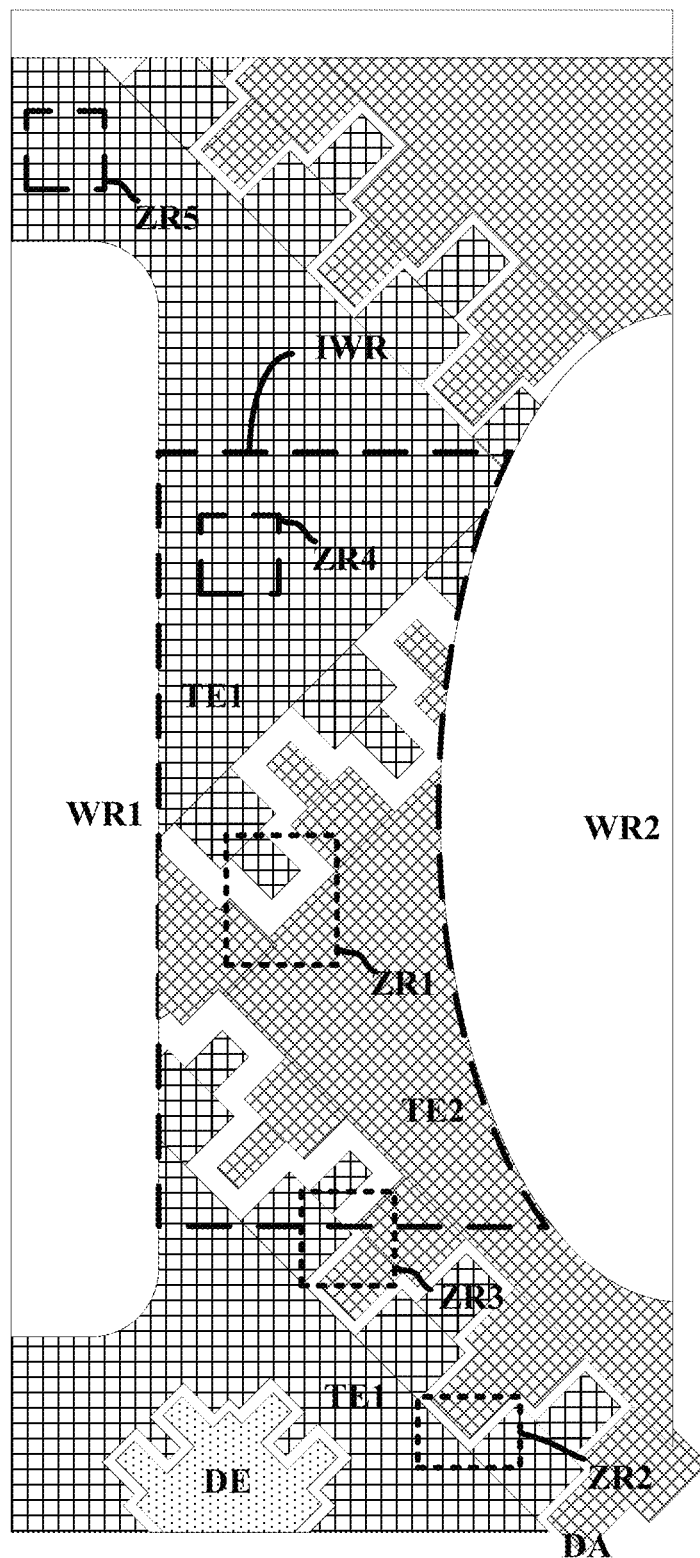
FIG. 4 is a zoom-in view of a region surrounding an inter-window region of a display panel in some embodiments according to the present disclosure.

FIG. 4 is a zoom-in view of a region surrounding an inter-window region of a display panel in some embodiments according to the present disclosure. In some embodiments, the plurality of first touch electrodes and the plurality of second touch electrodes are mesh electrodes comprising mesh electrode lines. For example, the plurality of first touch electrodes have a mesh pattern, e.g., a net-shaped pattern, and the plurality of second touch electrodes have a mesh pattern. The mesh electrode lines typically have a line width in a range of 1 μm to 50 μm, e.g., 1 μm to 5 μm, 5 μm to 10 μm, 10 μm to 15 μm, 15 μm to 20 μm, 20 μm to 25 μm, 25 μm to 30 μm, 30 μm to 35 μm, 35 μm to 40 μm, 40 μm to 45 μm, or 45 μm to 50 μm.

Figure 5:
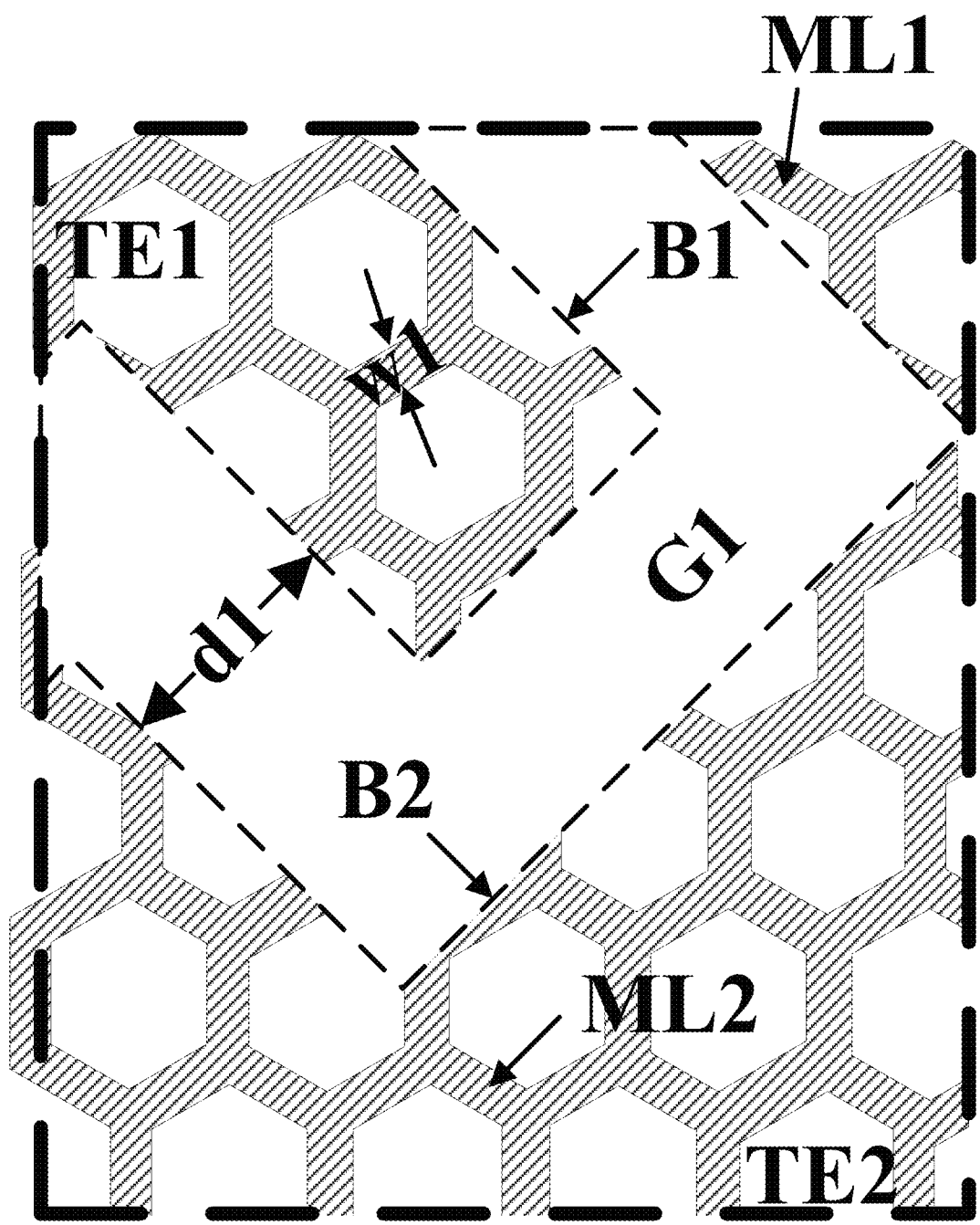
FIG. 5 is a zoom-in view of a first zoom-in region ZR1 in FIG. 4.
Figure 6:
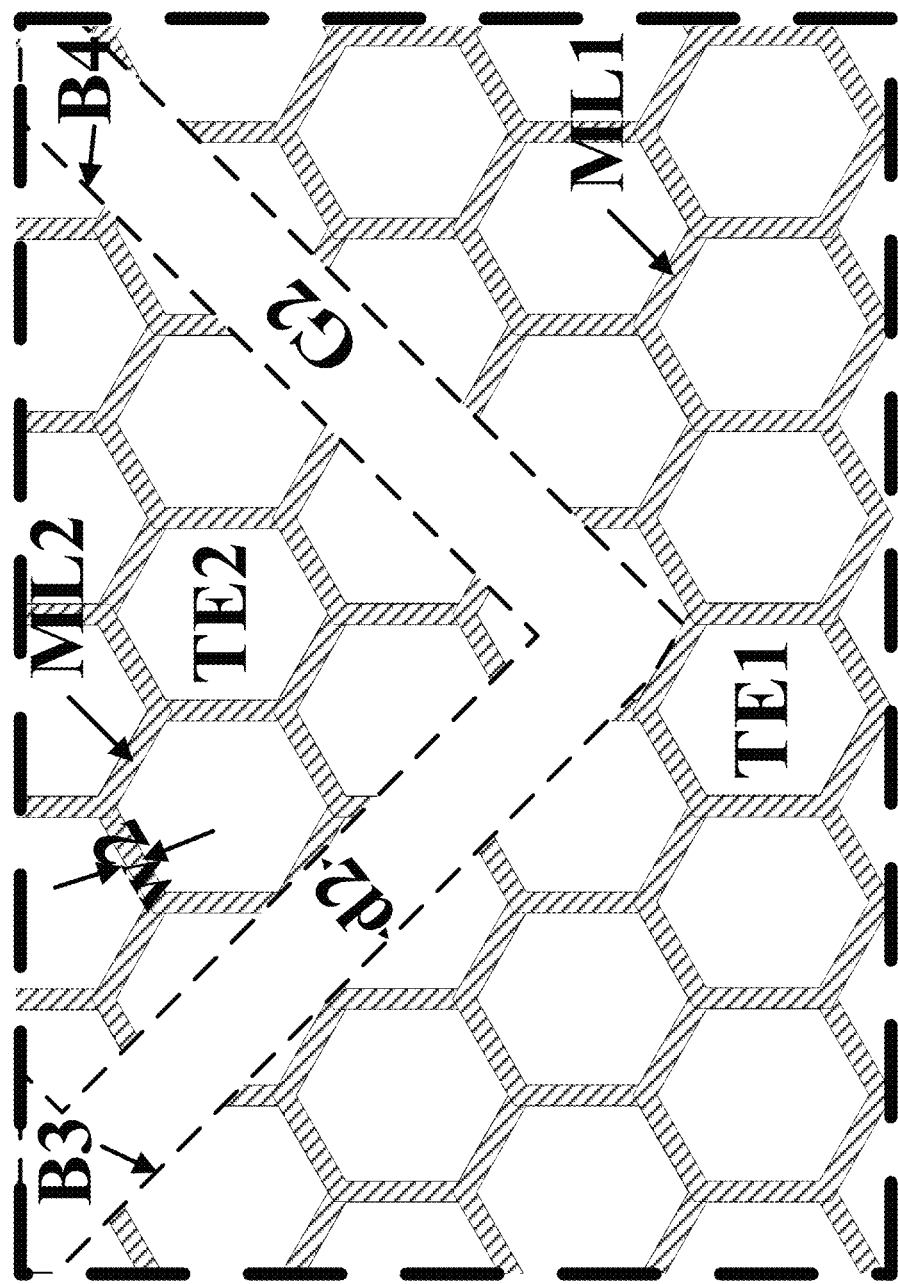
FIG. 6 is a zoom-in view of a second zoom-in region ZR2 in FIG. 4.

FIG. 5 is a zoom-in view of a first zoom-in region ZR1 in FIG. 4. FIG. 6 is a zoom-in view of a second zoom-in region ZR2 in FIG. 4. Referring to FIG. 5 and FIG. 6, in some embodiments, the plurality of first touch electrodes TE1 are a plurality of first mesh electrodes, each of which comprising a plurality of first mesh electrode lines ML1, the plurality of second touch electrodes TE2 are a plurality of second mesh electrodes, each of which comprising a plurality of second mesh electrode lines ML2. The first zoom-in region ZR1 is in the inter-window region IWR in FIG. 4. The second zoom-in region ZR2 is in the display region DA in FIG. 4. A first respective one of the plurality of first touch electrodes TE1 and a second respective one of the plurality of second touch electrodes TE2 directly adjacent to each other are spaced apart by a first gap G1 having a first gap width d1. A third respective one of the plurality of first touch electrodes TE1 and a fourth respective one of the plurality of second touch electrodes TE2 directly adjacent to each other are spaced apart by a second gap G2 having a second gap width d2. The first gap width d1 is greater than the second gap width d2. The first gap G1 has a first boundary B1 formed by virtually connecting outer edges of multiple first mesh electrode lines of the first respective one of the plurality of first touch electrodes TE1, and a second boundary B2 formed by virtually connecting outer edges of multiple second mesh electrode lines of the second respective one of the plurality of second touch electrodes TE2. The second gap G2 has a third boundary B3 formed by virtually connecting outer edges of multiple first mesh electrode lines of the third respective one of the plurality of first touch electrodes TE1, and a fourth boundary B4 formed by virtually connecting outer edges of multiple second mesh electrode lines of the fourth respective one of the plurality of second touch electrodes TE2. Optionally, the first gap width d1 is a first shortest distance between the first boundary B1 and the second boundary B2. Optionally, the second gap width d2 is a second shortest distance between the third boundary B3 and the fourth boundary B4.

In some embodiments, as shown in FIG. 5 and FIG. 6, a respective one of the plurality of first mesh electrode lines ML1 in the inter-window region IWR has a first line width w1, a respective one of the plurality of second mesh electrode lines ML2 in the display region DA has a second line width w2. Optionally, the first line width w1 is greater than the second line width w2. Optionally, the first line width w1 is greater than the second line width w2 by at least 5%, e.g., by at least 10%, by at least 15%, by at least 20%, by at least 25%, by at least 30%, by at least 35%, by at least 40%, by at least 45%, or by at least 50%. Optionally, the first line width w1 is in a range of 2 μm to 10 μm, e.g., 2 μm to 3 μm, 3 μm to 4 μm, 4 μm to 5 μm, 5 μm to 6 μm, 6 μm to 7 μm, 7 μm to 8 μm, 8 μm to 9 μm, or 9 μm to 10 μm. Optionally, the second line width w2 is in a range of 1 μm to 5 μm, e.g., 1 μm to 2 μm, 2 μm to 3 μm, 3 μm to 4 μm, or 4 μm to 5 μm.

In one example, the first line width w1 is approximately 4 µm, and the second line width w2 is approximately 3 µm.

Figure 7:
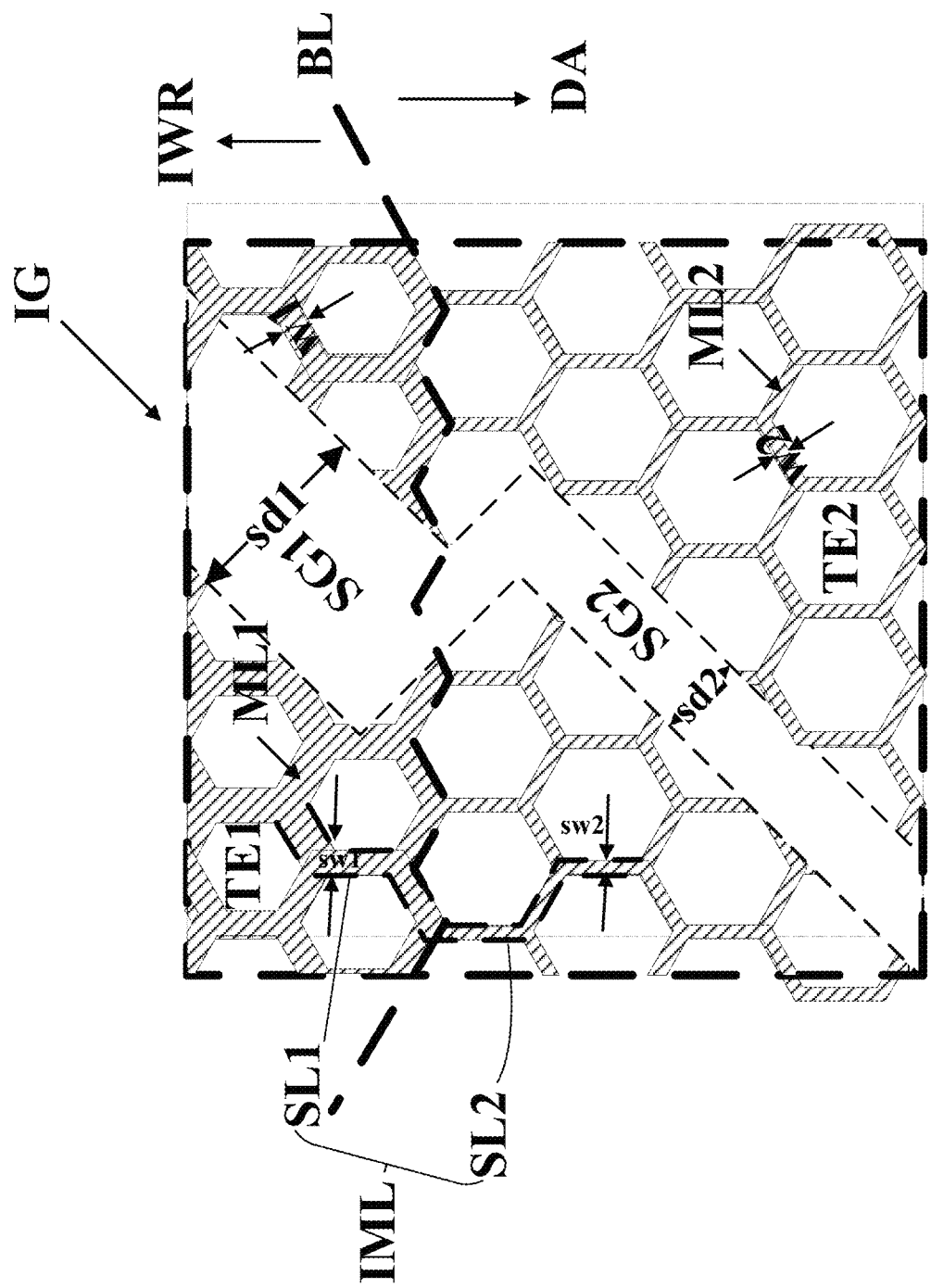
FIG. 7 is a zoom-in view of a third zoom-in region ZR3 in FIG. 4.

FIG. 7 is a zoom-in view of a third zoom-in region ZR3 in FIG. 4. The third zoom-in region ZR3 crosses over the inter-window region IWR to the display region DA in FIG. 4. Referring to FIG. 7, an inter-region boundary BL between the inter-window region IWR and the display region DA is defined by an imaginary line through which line widths of the mesh electrode lines transition from the first line width w1 to the second line width w2. At least a portion of the inter-region boundary BL in FIG. 7 is an undulating virtual line along a continuous edge of a respective one of the plurality of second mesh electrode lines ML2.

Figure 8:
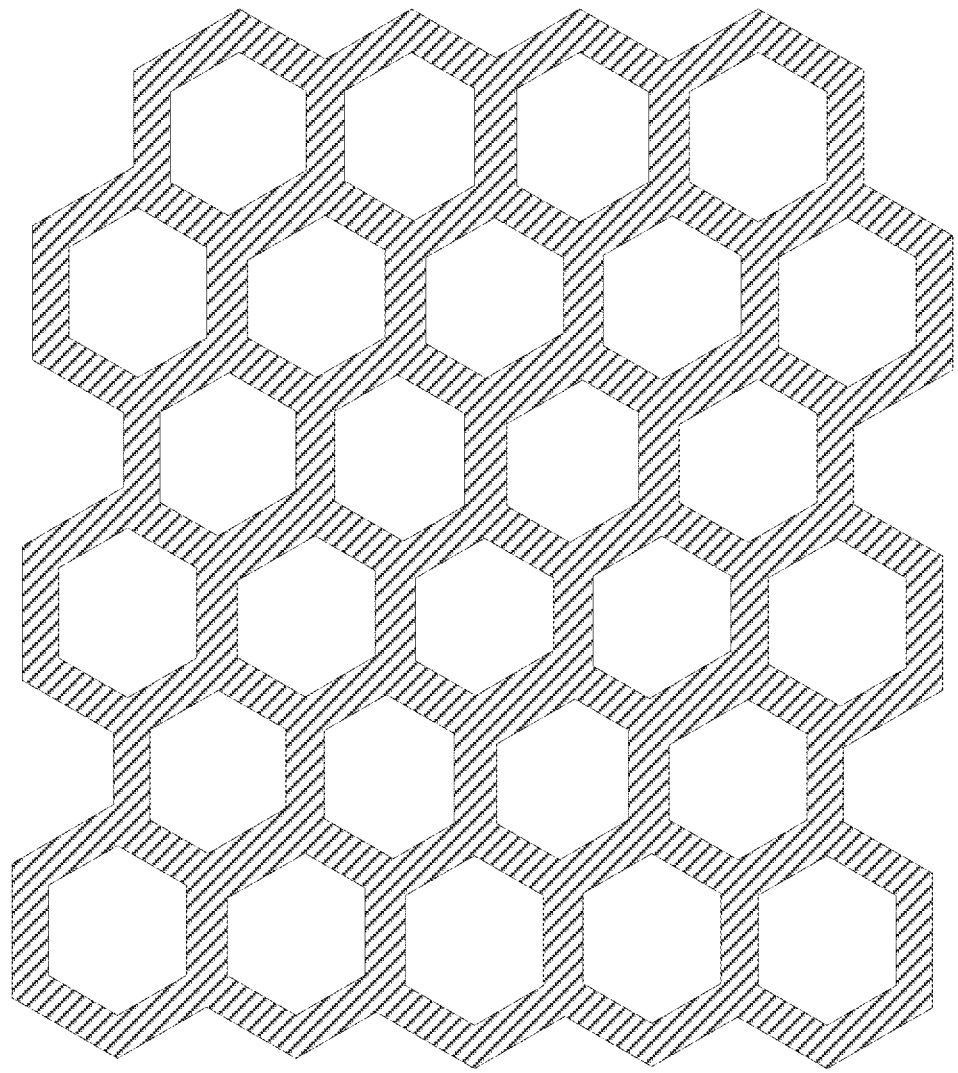
FIG. 8 is a zoom-in view of a third zoom-in region ZR4 in FIG. 4.
Figure 9:
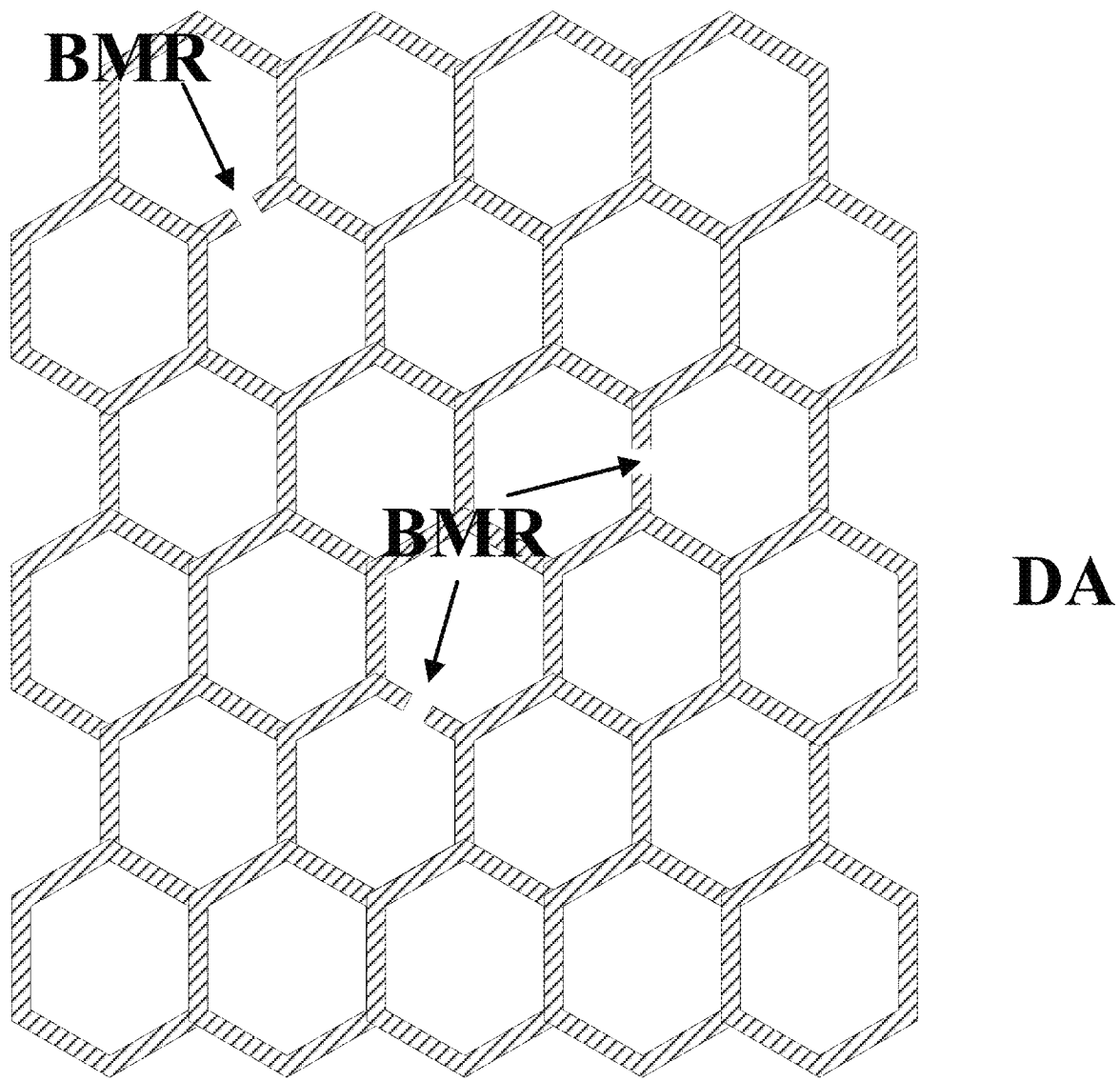
FIG. 9 is a zoom-in view of a third zoom-in region ZR5 in FIG. 4.

In some embodiments, the display panel further includes a plurality of blanking mesh breaks. As used herein, the term "blanking mesh break" refers to a break in a mesh electrode line in an individual mesh electrode block (i.e., not a gap separating adjacent mesh electrode blocks) for achieving an excellent blanking effect in the display panel. Mesh electrode lines are otherwise inter-connected elsewhere in the individual mesh electrode block except for positions having the plurality of blanking mesh breaks. FIG. 8 is a zoom-in view of a third zoom-in region ZR4 in FIG. 4. FIG. 9 is a zoom-in view of a third zoom-in region ZR5 in FIG. 4. Referring to FIG. 8 and FIG. 9, in some embodiments, the plurality of blanking mesh breaks BMR are limited in mesh electrode blocks in the display region DA, and absent in the inter-window region IWR, the first window region WR1, and the second window region WR2.

Optionally, both the plurality of fill patterns DE and the plurality of blanking mesh breaks BMR are limited in mesh electrode blocks in the display region DA; and both the plurality of fill patterns DE and the plurality of blanking mesh breaks BMR are absent in the inter-window region IWR, the first window region WR1, and the second window region WR2.

Optionally, the plurality of blanking mesh breaks BMR are randomly distributed in the display region DA. The plurality of blanking mesh breaks BMR themselves do not form a pattern so that an excellent blanking effect can be achieved. For example, the plurality of blanking mesh breaks BMR do not have a repeating pattern, and do not have rotational or translational symmetry between mesh electrode blocks.

Figure 10:
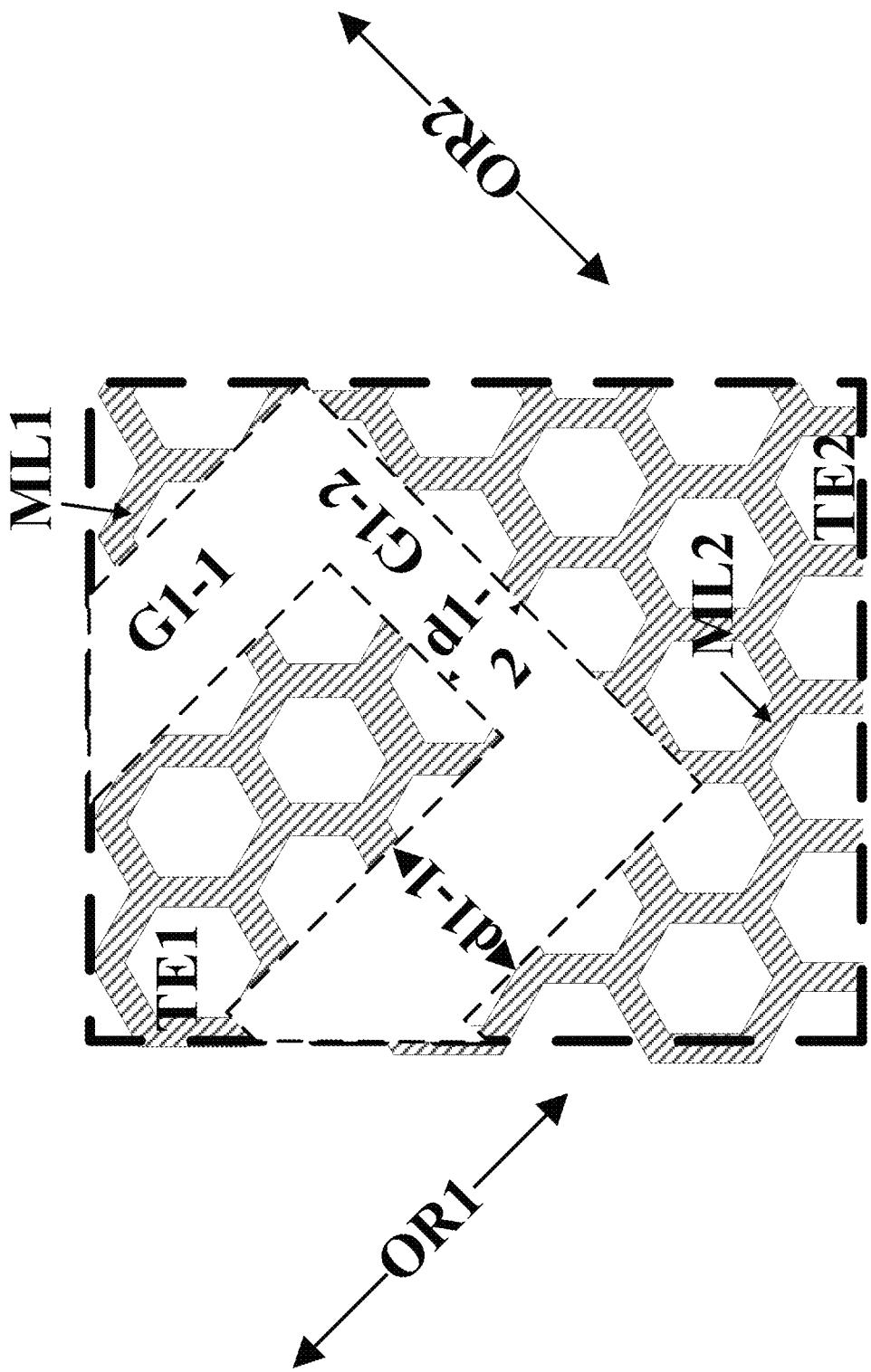
FIG. 10 illustrates a first gap in an inter-window region in a display panel in some embodiments according to the present disclosure.

FIG. 10 illustrates a first gap in an inter-window region in a display panel in some embodiments according to the present disclosure. Referring to FIG. 10, in some embodiments, the first gap (denoted as "G1" in FIG. 5) includes a plurality of first portions G1-1, each of which oriented along a first orientation OR1; and a plurality of second portions G1-2, each of which oriented along a second orientation OR2. Optionally, a respective one of the plurality of first portions G1-1 has a first portion gap width d1-1, and a respective one of the plurality of second portions G1-2 has a second portion gap width d1-2. The first portion gap width d1-1 and the second portion gap width d1-2 may be the same (as it is the case in FIG. 5). Optionally, the first portion gap width d1-1 and the second portion gap width d1-2 are different from each other. Optionally, the first portion gap width d1-1 is greater than the second portion gap width d1-2. Optionally, the first portion gap width d1-1 is in a range of 5 µm to 50 µm, e.g., 5 µm to 10 µm, 10 µm to 15 µm, 15 µm to 20 µm, 20 µm to 25 µm, 25 µm to 30 µm, 30 µm to 35 µm, 35 µm to 40 µm, 40 µm to 45 µm, or 45 µm to 50 µm. Optionally, the second portion gap width d1-2 is in a range of 5 µm to 50 µm, e.g., 5 µm to 10 µm, 10 µm to 15 µm, 15 µm to 20 µm, 20 µm to 25 µm, 25 µm to 30 µm, 30 µm to 35 µm, 35 µm to 40 µm, 40 µm to 45 µm, or 45 µm to 50 µm.

Figure 11:
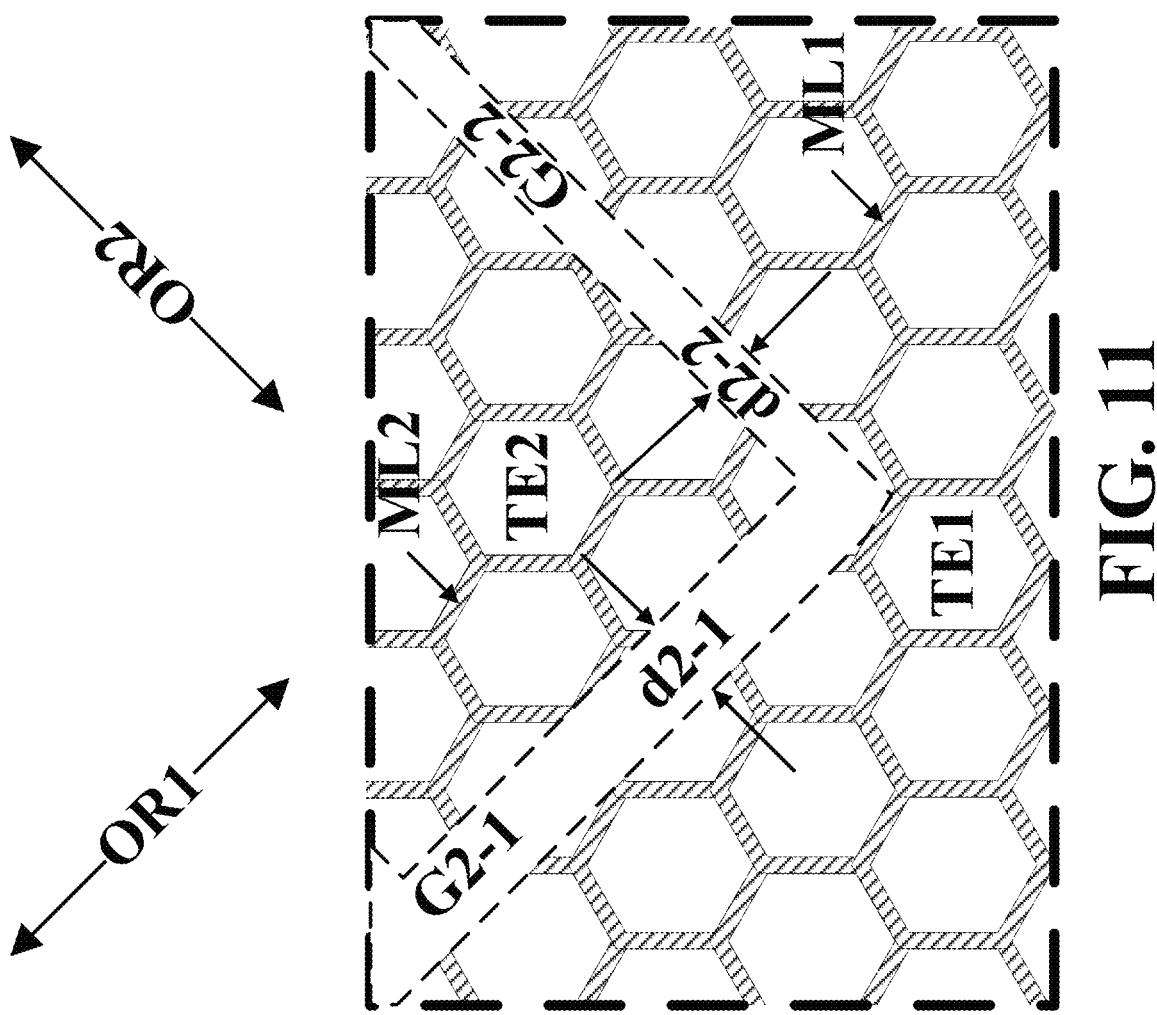
FIG. 11 illustrates a second gap in a display region in a display panel in some embodiments according to the present disclosure.

FIG. 11 illustrates a second gap in a display region in a display panel in some embodiments according to the present disclosure. Referring to FIG. 10, in some embodiments, the second gap (denoted as "G2" in FIG. 6) includes a plurality of third portions G2-1, each of which oriented along the first orientation OR1; and a plurality of fourth portions G2-2, each of which oriented along the second orientation OR2. Optionally, a respective one of the plurality of third portions G2-1 has a third portion gap width d2-1, and a respective one of the plurality of fourth portions G1-2 has a fourth portion gap width d2-2. The third portion gap width d2-1 and the fourth portion gap width d2-2 may be the same (as it is the case in FIG. 5). Optionally, the third portion gap width d2-1 and the fourth portion gap width d2-2 are different from each other. Optionally, the third portion gap width d2-1 is greater than the fourth portion gap width d2-2. Optionally, the third portion gap width d2-1 is in a range of 1 µm to 10 µm, e.g., 1 µm to 2 µm, 2 µm to 3 µm, 3 µm to 4 µm, 4 µm to 5 µm, 5 µm to 6 µm, 6 µm to 7 µm, 7 µm to 8 µm, 8 µm to 9 µm, or 9 µm to 10 µm. Optionally, the fourth portion gap width d2-2 is in a range of 1 µm to 10 µm, e.g., 1 µm to 2 µm, 2 µm to 3 µm, 3 µm to 4 µm, 4 µm to 5 µm, 5 µm to 6 µm, 6 µm to 7 µm, 7 µm to 8 µm, 8 µm to 9 µm, or 9 µm to 10 µm.

In some embodiments, portion gap widths of portion gaps of the first gap along each orientation are greater than portion gap widths of portion gaps of the second gap along a same respective orientation. Optionally, a portion gap width of a portion gap of the first gap along a first orientation is greater than a portion gap width of a portion gap of the second gap along the first orientation, and a portion gap width of a portion gap of the first gap along a second orientation is greater than a portion gap width of a portion gap of the second gap along the second orientation. In one example, and referring to FIG. 10 and FIG. 11, the first portion gap width d1-1 is greater than the third portion gap width d2-1, and the second portion gap width d1-2 is greater than the fourth portion gap width d2-2. In another example, the first portion gap width d1-1 is greater than the third portion gap width d2-1 and greater than the fourth portion gap width d2-2; and the second portion gap width d1-2 is greater than the third portion gap width d2-1 and greater than the fourth portion gap width d2-2.

In some embodiments, the term "the first gap width is greater than the second gap width" means that a smallest portion gap width (e.g., the second portion gap width d1-2) in the first gap is greater than a smallest portion gap width (e.g., the fourth portion gap width d2-2) in the second gap G2. Optionally, the smallest portion gap width in the first gap is greater than the smallest portion gap width in the second gap by at least 20%, e.g., by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, by at least 200%, by at least 225%, by at least 250%, or by at least 300%.

In some embodiments, the term "the first gap width is greater than the second gap width" means that a smallest portion gap width (e.g., the second portion gap width d1-2) in the first gap is greater than a smallest portion gap width (e.g., the fourth portion gap width d2-2) in the second gap G2; and that a largest portion gap width (e.g., the first portion gap width d1-1) in the first gap is greater than a largest portion gap width (e.g., the third portion gap width d2-1) in the second gap G2. Optionally, the smallest portion gap width in the first gap is greater than the smallest portion gap width in the second gap by at least 20%, e.g., by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, by at least 200%, by at least 225%, by at least 250%, or by at least 300%; and the largest portion gap width in the first gap is greater than the largest portion gap width in the second gap by at least 20%, e.g., by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, by at least 200%, by at least 225%, by at least 250%, or by at least 300%.

In some embodiments, the term "the first gap width is greater than the second gap width" means that a smallest portion gap width (e.g., the second portion gap width d1-2) in the first gap is greater than any portion gap width (e.g., the third portion gap width d2-1 or the fourth portion gap width d2-2) in the second gap G2. Optionally, the smallest portion gap width in the first gap is greater than any portion gap width in the second gap by at least 20%, e.g., by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, by at least 200%, by at least 225%, by at least 250%, or by at least 300%.

In some embodiments, the term "the first gap width is greater than the second gap width" means that an average portion gap width (e.g., an average of the first portion gap width d1-1 and the second portion gap width d1-2) in the first gap is greater than an average gap width (e.g., an average of the third portion gap width d2-1 and the fourth portion gap width d2-2) in the second gap G2. Optionally, the average portion gap width in the first gap is greater than the average portion gap width in the second gap by at least 20%. e.g., by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, by at least 200%, by at least 225%, by at least 250%, or by at least 300%.

Figure 12:
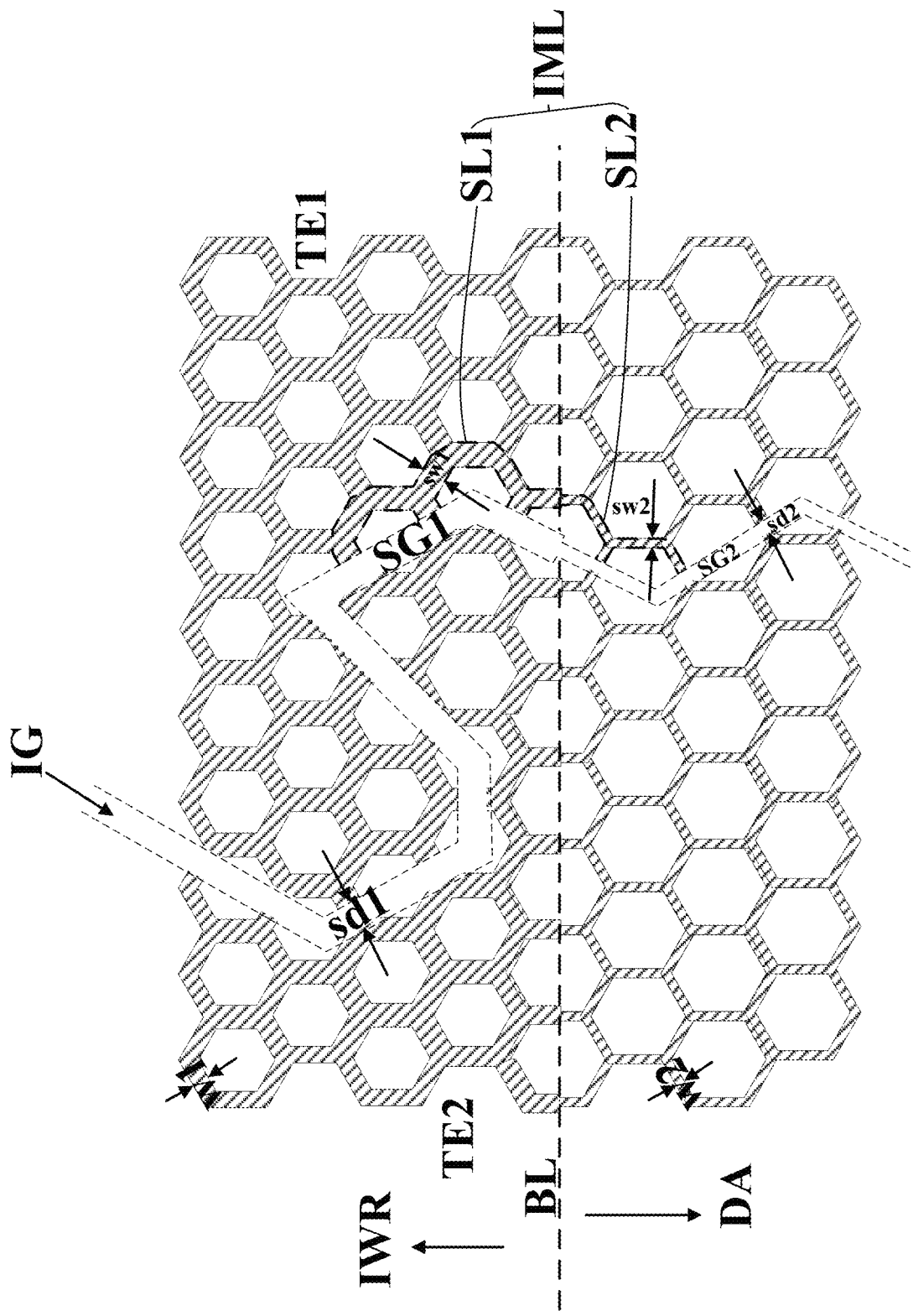
FIG. 12 is a zoom-in view of a region surrounding a boundary between an inter-window region and a display region of a display panel in some embodiments according to the present disclosure.

FIG. 12 is a zoom-in view of a region surrounding a boundary between an inter-window region and a display region of a display panel in some embodiments according to the present disclosure. Referring to FIG. 12, a portion of the inter-region boundary BL in FIG. 7 is a straight virtual line.

Referring to FIG. 7 and FIG. 12, in some embodiments, the mesh electrode lines includes an inter-region mesh electrode line IML extending from the inter-window region IWR into the display region DA. The inter-region mesh electrode line IML includes a first sub-line SL1 in the inter-window region IWR and a second sub-line SL2 in the display region DA, the first sub-line SL1 directly connected with the second sub-line SL2. Optionally, the first sub-line SL1 has a first sub-line width sw1. Optionally, the second sub-line has a second sub-line width sw2. Optionally, the first sub-line width sw1 is greater than the second sub-line width sw2. Optionally, the first sub-line width sw1 is the same as the first line width w1, and the second sub-line width sw2 is the same as the second line width w2. Optionally, the first sub-line width sw1 is greater than the second sub-line width sw2 by at least 5%, e.g., by at least 10%, by at least 15%, by at least 20%, by at least 25%, by at least 30%, by at least 35%, by at least 40%, by at least 45%, or by at least 50%. Optionally, the first sub-line width sw1 is in a range of 2 μm to 10 μm, e.g., 2 μm to 3 μm, 3 μm to 4 μm, 4 μm to 5 μm, 5 μm to 6 μm, 6 μm to 7 μm, 7 μm to 8 μm, 8 μm to 9 μm, or 9 μm to 10 μm. Optionally, the second sub-line width sw2 is in a range of 1 μm to 5 μm, e.g., 1 μm to 2 μm, 2 μm to 3 μm, 3 μm to 4 μm, or 4 μm to 5 μm. In one example, the first sub-line width sw1 is approximately 4 μm, and the second sub-line width sw2 is approximately 3 μm.

Referring to FIG. 7 and FIG. 12, in some embodiments, a fifth respective one of the plurality of first touch electrodes TEL and a sixth respective one of the plurality of second touch electrodes TE2 directly adjacent to each other are spaced apart by an inter-region gap IG extending from the inter-window region IWR into the display region DA. Optionally, the inter-region gap IG includes a first sub-gap SG1 in the inter-window region IWR and a second sub-gap SG2 in the display region DA, the first sub-gap SG1 directly connected with the second sub-gap SG2. Optionally, the first sub-gap SG1 has a first sub-gap width sd1. Optionally, the second sub-gap SG2 has a second sub-gap width sd2. Optionally, the first sub-gap width sd1 is greater than the second sub-gap width sd2. Optionally, the first sub-gap width sd1 is the same as the first gap width d1, and the second sub-gap width sd2 is the same as the second gap width d2. Optionally, the first sub-gap width sd1 is greater than the second sub-gap width sd2 by at least 20%, e.g., by at least 30%, by at least 40%, by at least 50%, by at least 60%, by at least 70%, by at least 80%, by at least 90%, by at least 100%, by at least 110%, by at least 120%, by at least 130%, by at least 140%, by at least 150%, by at least 160%, by at least 170%, by at least 180%, by at least 190%, by at least 200%, by at least 225%, by at least 250%, or by at least 300%. Optionally, the first sub-gap width sd1 is in a range of 5 μm to 50 μm, e.g., 5 μm to 10 μm, 10 μm to 15 μm, 15 μm to 20 μm, 20 μm to 25 μm, 25 μm to 30 μm, 30 μm to 35 μm, 35 μm to 40 μm, 40 μm to 45 μm, or 45 μm to 50 μm. Optionally, the second sub-gap width sd2 is in a range of 1 μm to 10 μm, e.g., 1 μm to 2 μm, 2 μm to 3 μm, 3 μm to 4 μm, 4 μm to 5 μm, 5 μm to 6 μm, 6 μm to 7 μm, 7 μm to 8 μm, 8 μm to 9 μm, or 9 μm to 10 μm. In one example, the first sub-gap width sd1 is approximately 10 μm, and the second sub-gap width sd2 is approximately 5.2 μm. Optionally, multiple mesh electrode lines directly adjacent to the first sub-gap SG1 have a line width greater than multiple mesh electrode lines directly adjacent to the second sub-gap SG2.

Referring to FIG. 12, in some embodiments, the mesh electrode lines includes an inter-region mesh electrode line IML directly adjacent to the inter-region gap IG extending from the inter-window region IWR into the display region DA, and the inter-region mesh electrode line IML also extends from the inter-window region IWR into the display region DA. Optionally, the inter-region gap IG includes a first sub-gap SG1 in the inter-window region IWR and a second sub-gap SG2 in the display region DA, the first sub-gap SG1 directly connected with the second sub-gap SG2. Optionally, the first sub-gap has a first sub-gap width sd1. Optionally, the second sub-gap has a second sub-gap width sd2. Optionally, the first sub-gap width sd1 is greater than the second sub-gap width sd2. Optionally, the first sub-gap width sd1 is the same as the first gap width d1, and the second sub-gap width sd2 is the same as the second gap width d2. Optionally, at least a first portion of a boundary of the first sub-gap SG1 in the inter-window region IWR is formed by virtually connecting outer edges of the first sub-line SL1 of the inter-region mesh electrode line IML, and at least a second portion of a boundary of the second sub-gap SG2 in the display region DA is formed by virtually connecting outer edges of the second sub-line SL2 of the inter-region mesh electrode line IML. Optionally, the first portion and the second portion are directly connected.

Figure 13A:
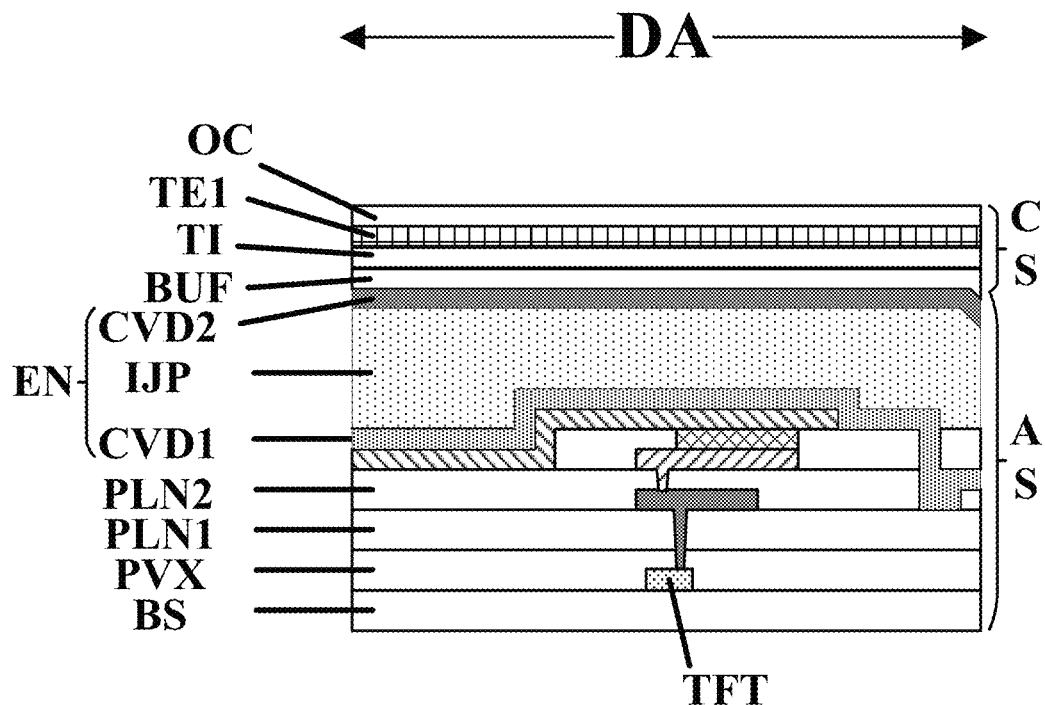
FIG. 13A is a partial cross-sectional view of a display panel in an inter-window region in some embodiments according to the present disclosure.
Figure 13B:
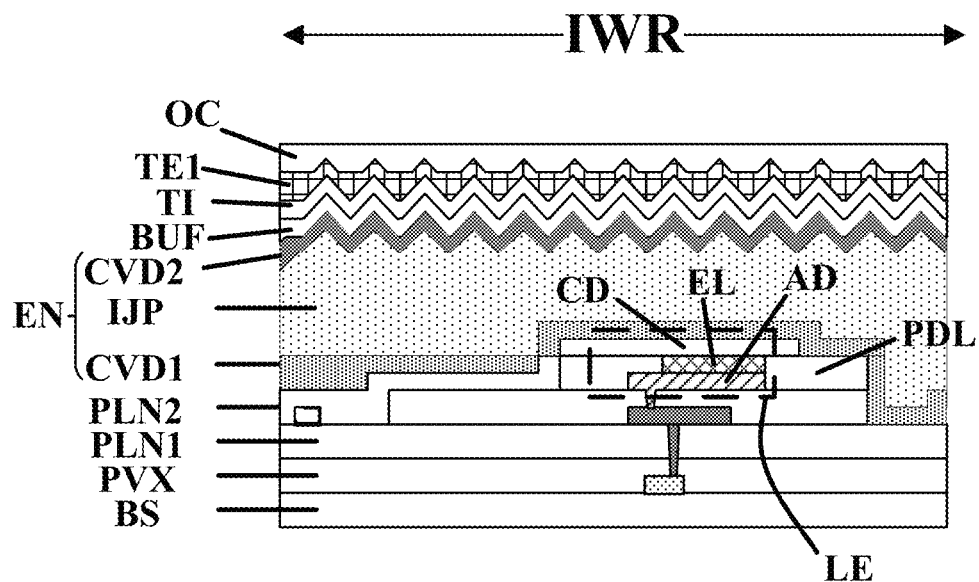
FIG. 13B is a partial cross-sectional view of a display panel in a display region in some embodiments according to the present disclosure.

FIG. 13A is a partial cross-sectional view of a display panel in an inter-window region in some embodiments according to the present disclosure. FIG. 13B is a partial cross-sectional view of a display panel in a display region in some embodiments according to the present disclosure. Referring to FIG. 13A and FIG. 13B, in some embodiments, the display panel includes a touch insulating layer TI underneath (e.g., directly underneath) the touch electrode layer and in contact with the touch electrode layer (e.g., the plurality of first touch electrodes TE1). Optionally, the touch insulating layer TI has a first contacting surface CS1 in contact with the touch electrode layer in the inter-window region IWR and a second contacting surface CS2 in contact with the touch electrode layer in the display region DA. Optionally, the first contacting surface CS1 has a first degree of unevenness. Optionally, the second contacting surface CS2 has a second degree of unevenness. Optionally, the first degree of unevenness is greater than the second degree of unevenness. The higher degree of unevenness in the inter-window region IWR is due to the higher degree of unevenness in the encapsulating layer EN underneath the touch electrode layer, the touch insulating layer TI, and the buffer layer BUF. It is discovered in the present disclosure that it is more difficult to form an even surface in the inter-window region IWR as compared to in the display region DA when forming the encapsulating layer EN. As a result, the first contacting surface CS1 has a higher degree of unevenness than the second contacting surface CS2. The touch electrode layer in the inter-window region IWR are prone to line break or short. Having the mesh electrode blocks spacing apart by a wider gap in the inter-window region IWR and having a greater line width in the inter-window region IWR greatly help preventing these issues.

In another aspect, the present disclosure provides a method of fabricating a display panel having an array substrate and a counter substrate assembled together. In some embodiments, the method includes forming a first hole in a first window region; and forming a second hole in a second window region. The display panel is formed to have a display region configured to display an image, the first window region, the second window region, and an inter-window region between the first window region and the second window region. The inter-window region is directly adjacent to the first window region and directly adjacent to the second window region. Optionally, the method further includes forming a touch electrode layer in the display region and in the inter-window region. Optionally, forming the touch electrode layer includes forming a plurality of first touch electrodes and forming a plurality of second touch electrodes. Optionally, forming the touch electrode layer includes forming a first gap having a first gap width in the inter-window region to space apart a first respective one of the plurality of first touch electrodes and a second respective one of the plurality of second touch electrodes directly adjacent to each other and in the inter-window region; and forming a second gap having a second gap width in the display region to space apart a third respective one of the plurality of first touch electrodes and a fourth respective one of the plurality of second touch electrodes directly adjacent to each other and in the display region. Optionally, the first gap width is greater than the second gap width.

Figure 14A:
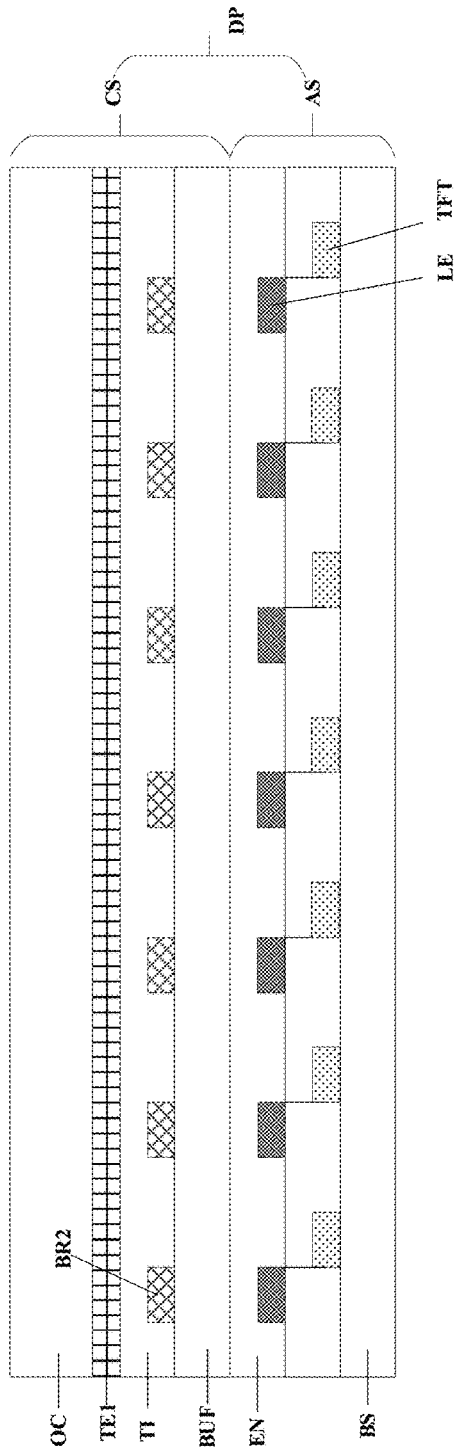
FIGS. 14A to 14B illustrate a method of fabricating a display panel in some embodiments according to the present disclosure.
Figure 14B:
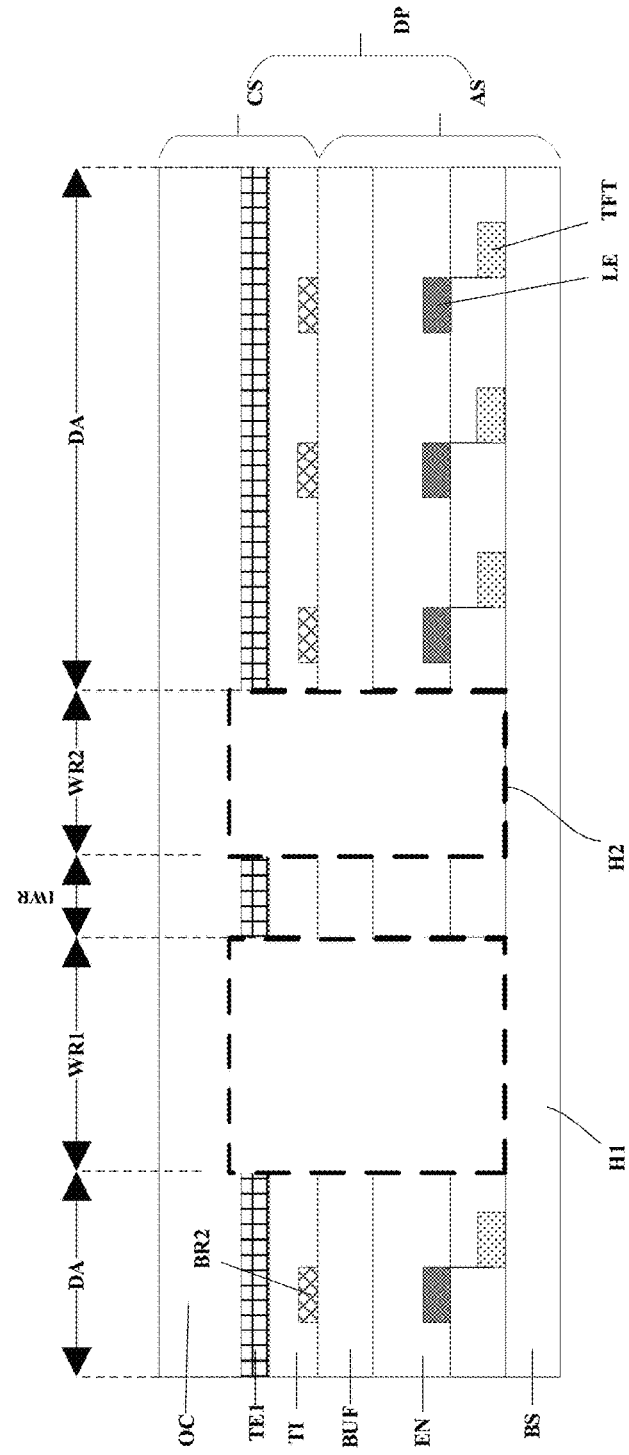

FIGS. 14A to 14B illustrate a method of fabricating a display panel in some embodiments according to the present disclosure. Referring to FIG. 14A, an array substrate AS and a counter substrate CS are assembled together. The step of forming the array substrate AS includes forming a plurality of thin film transistors TFT on a base substrate BS, and forming a plurality of light emitting elements LE on the base substrate BS and respectively connected to the plurality of thin film transistors TFT. Optionally, the step of forming the array substrate further includes forming an encapsulating layer EN encapsulating the plurality of light emitting elements LE. The step of forming the counter substrate CS includes forming a buffer layer BUF, a touch insulating layer TI on the buffer layer BUF, and a touch electrode layer on a side of the touch insulating layer TI away from the buffer layer BUF. The step of forming the touch electrode layer in some embodiments includes forming a plurality of first touch electrodes TE1.

Referring to FIG. 14B, the method in some embodiments forming a first hole H1 in a first window region WR1; and forming a second hole H2 in a second window region WR2. Accordingly, the display panel is formed to have a display region DA configured to display an image, the first window region WR1, the second window region WR2, and an inter-window region IWR between the first window region WR1 and the second window region WR2. The inter-window region IWR is directly adjacent to the first window region WR1 and directly adjacent to the second window region WR2.

By forming the first hole H1 and the second hole H2, the touch electrode layer, the thin film transistors, and the display elements are removed from the first window region WR1 and the second window region WR2. Optionally, the encapsulating layer EN, the buffer layer BUF, and the touch insulating layer TI are also absent in the first window region WR1 and absent in the second window region WR2.

Accordingly, the touch electrode layer is formed in the display region DA and in the inter-window region IWR. Referring to FIGS. 2A, 2B, 3A, 3B, and 4-8, in some embodiments, the step of forming the touch electrode layer includes forming a plurality of first touch electrodes TE1 and forming a plurality of second touch electrodes TE2.

In some embodiments, the step of forming the touch electrode layer includes forming a touch electrode material layer, and patterning the touch electrode material layer to form the plurality of first touch electrodes TE1 and the plurality of second touch electrodes TE2. In some embodiments, the step of patterning the touch electrode material layer includes forming a first gap G1 having a first gap width d1 in the inter-window region IWR to space apart a first respective one of the plurality of first touch electrodes TE1 and a second respective one of the plurality of second touch electrodes TE2 directly adjacent to each other and in the inter-window region IWR; and forming a second gap G2 having a second gap width d2 in the display region DA to space apart a third respective one of the plurality of first touch electrodes TE1 and a fourth respective one of the plurality of second touch electrodes TE2 directly adjacent to each other and in the display region DA. Optionally, the first gap width d1 is greater than the second gap width d2.

In some embodiments, and referring to FIGS. 2A, 2B, 3A, 3B, and 4-8, the step of forming the touch electrode layer includes forming an inter-region gap IG extending from the inter-window region IWR into the display region DA to space apart a fifth respective one of the plurality of first touch electrodes TE1 and a sixth respective one of the plurality of second touch electrodes TE2 directly adjacent to each other. Optionally, forming the inter-region gap IG includes forming a first sub-gap SG1 in the inter-window region IWR and forming a second sub-gap SG2 in the display region DA, the first sub-gap SG1 directly connected with the second sub-gap SG2. Optionally, the first sub-gap has a first sub-gap width sd1. Optionally, the second sub-gap has a second sub-gap width sd2. Optionally, the first sub-gap width sd1 is greater than the second sub-gap width sd2. Optionally, the first sub-gap width sd1 is the same as the first gap width d1, and the second sub-gap width sd2 is the same as the second gap width d2.

In some embodiments, the plurality of first touch electrodes and the plurality of second touch electrodes are formed as mesh electrodes comprising mesh electrode lines. Various appropriate conductive electrode materials and various appropriate fabricating methods may be used to make the touch electrode layer. For example, a conductive electrode material may be deposited on the substrate, e.g., by sputtering or vapor deposition or solution coating; and patterned. Examples of conductive electrode materials for making the mesh electrode pattern of the touch electrode layer include, but are not limited to, a metal mesh, a silver nano wire, a carbon nano tube, a nano mesh, graphene, and conductive polymers such as poly(3,4-ethylenedioxythiophene) polystyrene sulfonate (PEDOT:PSS). Optionally, the mesh electrode pattern is made of a metal mesh such as a nano-silver mesh.

Optionally, multiple mesh electrode lines directly adjacent to the first sub-gap SG1 have a line width greater than multiple mesh electrode lines directly adjacent to the second sub-gap SG2, as shown in FIG. 7 and FIG. 12.

In some embodiments, and referring to FIGS. 2A, 2B, 3A, 3B, and 4-8, the step of forming the plurality of first touch electrodes comprises forming a plurality of first mesh electrodes, each of which comprising a plurality of first mesh electrode lines ML1; and forming the plurality of second touch electrodes comprises forming a plurality of second mesh electrodes, each of which comprising a plurality of second mesh electrode lines ML2. Optionally, a first boundary B1 of the first gap G1 is formed by virtually connecting outer edges of multiple first mesh electrode lines of the first respective one of the plurality of first touch electrodes TE1, and a second boundary B2 of the first gap G1 is formed by virtually connecting outer edges of multiple second mesh electrode lines of the second respective one of the plurality of second touch electrodes TE2. Optionally, a third boundary B3 of the second gap G2 is formed by virtually connecting outer edges of multiple first mesh electrode lines of the third respective one of the plurality of first touch electrodes TE1, and a fourth boundary B4 of the second gap is formed by virtually connecting outer edges of multiple second mesh electrode lines of the fourth respective one of the plurality of second touch electrodes TE2. Optionally, the first gap width d1 is a first shortest distance between the first boundary B1 and the second boundary B2. Optionally, the second gap width d2 is a second shortest distance between the third boundary B3 and the fourth boundary B4.

In some embodiments, and referring to FIG. 7 and FIG. 12, the plurality of first touch electrodes TE1 and the plurality of second touch electrodes TE2 are mesh electrodes comprising mesh electrode lines. The step of forming the mesh electrode lines includes forming a plurality of first mesh electrode lines ML1 in the inter-window region IWR and forming a plurality of second mesh electrode lines ML2 in the display region DA. Optionally, a respective one of the plurality of first mesh electrode lines ML1 has a first line width w1. Optionally, a respective one of the plurality of second mesh electrode lines ML2 has a second line width w2. Optionally, the first line width w1 is greater than the second line width w2. Optionally, an inter-region boundary BL between the inter-window region IWR and the display region DA is defined by an imaginary line through which line widths of the mesh electrode lines transition from the first line width w1 to the second line width w2.

In some embodiments, and referring to FIG. 7 and FIG. 12, the step of forming the mesh electrode lines includes forming an inter-region mesh electrode line IML extending from the inter-window region IWR into the display region DA. Optionally, the step of forming the inter-region mesh electrode line IML includes forming a first sub-line SL1 in the inter-window region IWR and forming a second sub-line SL2 in the display region DA, the first sub-line SL1 directly connected with the second sub-line SL2. Optionally, the first sub-line SL1 has a first sub-line width sw1. Optionally, the second sub-line SL2 has a second sub-line width sw2. Optionally, the first sub-line width sw1 is greater than the second sub-line width sw2. Optionally, the first sub-line width sw1 is the same as the first line width w1, and the second sub-line width sw2 is the same as the second line width w2.

In some embodiments, and referring to FIG. 7 and FIG. 12, the inter-region mesh electrode line IML is directly adjacent to an inter-region gap IG extending from the inter-window region IWR into the display region DA. Optionally, forming the inter-region gap IG includes forming a first sub-gap SG1 in the inter-window region IWR and forming a second sub-gap SG2 in the display region DA, the first sub-gap SG1 directly connected with the second sub-gap SG2. Optionally, the first sub-gap SG1 has a first sub-gap width sd1. Optionally, the second sub-gap SG2 has a second sub-gap width sd2. Optionally, the first sub-gap width sd1 is greater than the second sub-gap width sd2.

In some embodiments, and referring to FIG. 3A and FIG. 3B, the method further includes forming a plurality of fill patterns DE in a same layer as the plurality of first touch electrodes TE1 and the plurality of second touch electrodes TE2, the plurality of fill patterns DE insulated from the plurality of first touch electrodes TE1 and the plurality of second touch electrodes TE2. Optionally, the plurality of fill patterns are limited in the display region, and absent in the inter-window region IWR, the first window region WR1, and the second window region WR2.

In another aspect, the present disclosure provides a display apparatus including a display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having an array substrate and a counter substrate assembled together;
    wherein the display panel has a display region configured to display an image, a first window region, a second window region, and an inter-window region between the first window region and the second window region;
    the display panel comprises a first hole in the first window region and a second hole in the second window region;
    the inter-window region is directly adjacent to the first window region and directly adjacent to the second window region;
    wherein the display panel comprises a touch electrode layer in the display region and in the inter-window region, the touch electrode layer comprising a plurality of first touch electrodes and a plurality of second touch electrodes;
    wherein, in a first region, a first respective one of the plurality of first touch electrodes and a second respective one of the plurality of second touch electrodes directly adjacent to each other are spaced apart by a first gap having a first gap width along a first direction;
    in a second region, a third respective one of the plurality of first touch electrodes and a fourth respective one of the plurality of second touch electrodes directly adjacent to each other are spaced apart by a second gap having a second gap width along the first direction; and
    the first gap width in at least a portion of the first gap is greater than the second gap width.

2. The display panel of claim 1, wherein the first region is in the inter-window region;
    the second region is in the display region; and
    the first window region, the second window region, and the inter-window region are surrounded by the display region.

3. The display panel of claim 1, further comprising a plurality of display elements in the display region and a plurality of dummy display elements in the inter-window region.

4. The display panel of claim 3, comprises:
    an anode on a side of a second planarization layer away from a first planarization layer, the anode is limited in the display region and absent in the inter-window region;
    a light emitting layer in the display region and in the inter-window region, the light emitting layer in the display region on a side of the anode away from the second planarization layer, the light emitting layer in the inter-window region on a side of the second planarization layer away from the first planarization layer; and
    a cathode layer in the display region and in the inter-window region, the cathode layer on a side of the light emitting layer away from the second planarization layer.

5. The display panel of claim 4, further comprising an encapsulating layer on a side of the cathode layer away from the light emitting layer, the encapsulating layer encapsulating the plurality of display elements in the display region and the dummy light emitting element in the inter-window region.

6. The display panel of claim 1, wherein display elements and thin film transistors are absent in the first window region and the second window region; and
    the display panel further comprises a first accessory installed in the first hole and a second accessory installed in the second hole.

7. The display panel of claim 1, wherein a fifth respective one of the plurality of first touch electrodes and a sixth respective one of the plurality of second touch electrodes directly adjacent to each other are spaced apart by an inter-region gap extending from the inter-window region into the display region;
    the inter-region gap comprises a first sub-gap in the inter-window region and a second sub-gap in the display region, the first sub-gap directly connected with the second sub-gap;
    the first sub-gap has a first sub-gap width;
    the second sub-gap has a second sub-gap width; and
    the first sub-gap width is greater than the second sub-gap width.

8. The display panel of claim 7, wherein the plurality of first touch electrodes and the plurality of second touch electrodes are mesh electrodes comprising mesh electrode lines;
    multiple mesh electrode lines directly adjacent to the first sub-gap have a line width greater than multiple mesh electrode lines directly adjacent to the second sub-gap.

9. The display panel of claim 1, wherein the plurality of first touch electrodes are a plurality of first mesh electrodes, each of which comprising a plurality of first mesh electrode lines;
    the plurality of second touch electrodes are a plurality of second mesh electrodes, each of which comprising a plurality of second mesh electrode lines;
    the first gap has a first boundary formed by virtually connecting outer edges of multiple first mesh electrode lines of the first respective one of the plurality of first touch electrodes, and a second boundary formed by virtually connecting outer edges of multiple second mesh electrode lines of the second respective one of the plurality of second touch electrodes;
    the second gap has a third boundary formed by virtually connecting outer edges of multiple first mesh electrode lines of the third respective one of the plurality of first touch electrodes, and a fourth boundary formed by virtually connecting outer edges of multiple second mesh electrode lines of the fourth respective one of the plurality of second touch electrodes;

the first gap width is a first shortest distance between the first boundary and the second boundary; and the second gap width is a second shortest distance between the third boundary and the fourth boundary.

10. The display panel of claim 1, wherein the plurality of first touch electrodes and the plurality of second touch electrodes are mesh electrodes comprising mesh electrode lines;

the mesh electrode lines comprises a plurality of first mesh electrode lines in the inter-window region and a plurality of second mesh electrode lines in the display region;

a respective one of the plurality of first mesh electrode lines has a first line width;

a respective one of the plurality of second mesh electrode lines has a second line width;

the first line width is greater than the second line width; and an inter-region boundary between the inter-window region and the display region is defined by an imaginary line through which line widths of the mesh electrode lines transition from the first line width to the second line width.

11. The display panel of claim 10, wherein the mesh electrode lines comprises an inter-region mesh electrode line extending from the inter-window region into the display region;

the inter-region mesh electrode line comprises a first sub-line in the inter-window region and a second sub-line in the display region, the first sub-line directly connected with the second sub-line;

the first sub-line has a first sub-line width;

the second sub-line has a second sub-line width; and the first sub-line width is greater than the second sub-line width.

12. The display panel of claim 11, wherein the inter-region mesh electrode line is directly adjacent to an inter-region gap extending from the inter-window region into the display region;

the inter-region gap comprises a first sub-gap in the inter-window region and a second sub-gap in the display region, the first sub-gap directly connected with the second sub-gap;

the first sub-gap has a first sub-gap width;

the second sub-gap has a second sub-gap width; and the first sub-gap width is greater than the second sub-gap width.

13. The display panel of claim 12, wherein at least a first portion of a boundary of the first sub-gap in the inter-window region is formed by virtually connecting outer edges of the first sub-line of the inter-region mesh electrode line;

at least a second portion of a boundary of the second sub-gap in the display region is formed by virtually connecting outer edges of the second sub-line of the inter-region mesh electrode line; and the first portion and the second portion are directly connected.

14. The display panel of claim 1, further comprising a plurality of fill patterns in a same layer as the plurality of first touch electrodes and the plurality of second touch electrodes, the plurality of fill patterns insulated from the plurality of first touch electrodes and the plurality of second touch electrodes;

wherein the plurality of fill patterns are limited in the display region, and absent in the inter-window region, the first window region, and the second window region.

15. The display panel of claim 1, further comprising a plurality of blanking mesh breaks, a respective one of which breaking a mesh electrode line in an individual mesh electrode block;

wherein the plurality of blanking mesh breaks are limited in the display region, and absent in the inter-window region, the first window region, and the second window region.

16. The display panel of claim 1, wherein the first gap comprises a plurality of first portions, each of which oriented along a first orientation, and a plurality of second portions, each of which oriented along a second orientation;

the second gap comprises a plurality of third portions, each of which oriented along the first orientation, and a plurality of fourth portions, each of which oriented along the second orientation;

a respective one of the plurality of first portions has a first portion gap width;

a respective one of the plurality of second portions has a second portion gap width;

a respective one of the plurality of third portions has a third portion gap width; and a respective one of the plurality of fourth portions has a fourth portion gap width.

17. The display panel of claim 16, wherein the first portion gap width is greater than the third portion gap width and the fourth portion gap width; and the second portion gap width is greater than the third portion gap width and the fourth portion gap width.

18. The display panel of claim 1, wherein the display panel comprises a touch insulating layer underneath the touch electrode layer and in contact with the touch electrode layer;

the touch insulating layer has a first contacting surface in contact with the touch electrode layer in the inter-window region and a second contacting surface in contact with the touch electrode layer in the display region;

the first contacting surface has a first degree of unevenness;

the second contacting surface has a second degree of unevenness; and the first degree of unevenness is greater than the second degree of unevenness.

19. The display panel of claim 1, wherein the display panel comprises an encapsulating layer underneath a touch control structure comprising the touch electrode layer, the encapsulating layer in contact with the touch control structure;

the encapsulating layer has a first contacting surface in contact with the touch control structure in the inter-window region and a second contacting surface in contact with the touch control structure in the display region;

the first contacting surface has a first degree of unevenness;

the second contacting surface has a second degree of unevenness; and the first degree of unevenness is greater than the second degree of unevenness.

20. The display panel of claim 19, wherein the touch control structure comprises a touch insulating layer between the touch electrode layer and the encapsulating layer;

the touch insulating layer is in contact with the touch electrode layer; and the touch insulating layer is conformally shaped in accordance with the encapsulating layer.

* * * * *